(12) United States Patent
Watanabe

(10) Patent No.: US 10,700,693 B2
(45) Date of Patent: Jun. 30, 2020

(54) ANALOG-DIGITAL CONVERTER, SEMICONDUCTOR DEVICE, AND VOLTAGE SIGNAL GENERATION METHOD

(71) Applicant: RENESAS ELECTRONICS CORPORATION, Tokyo (JP)

(72) Inventor: Akemi Watanabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/412,030

(22) Filed: May 14, 2019

(65) Prior Publication Data

US 2019/0386669 A1 Dec. 19, 2019

(30) Foreign Application Priority Data

Jun. 19, 2018 (JP) ................................. 2018-116150

(51) Int. Cl.
| | | |
|---|---|---|
| *H03M 1/06* | (2006.01) | |
| *H03M 1/00* | (2006.01) | |
| *H03M 1/44* | (2006.01) | |
| *H03M 3/00* | (2006.01) | |

(52) U.S. Cl.
CPC ......... *H03M 1/0648* (2013.01); *H03M 1/002* (2013.01); *H03M 1/442* (2013.01); *H03M 3/328* (2013.01); *H03M 3/43* (2013.01); *H03M 3/456* (2013.01); *H03M 3/458* (2013.01)

(58) Field of Classification Search
CPC .... H03M 1/0648; H03M 1/002; H03M 1/442; H03M 3/43; H03M 3/458; H03M 3/456; H03M 3/328
USPC .................................................. 341/131, 143
See application file for complete search history.

(56) References Cited

U.S. PATENT DOCUMENTS

| | | | |
|---|---|---|---|
| 7,696,910 B2 | 4/2010 | Koyama | |
| 8,223,050 B2 * | 7/2012 | Matsumoto | ........... H03M 3/332 341/131 |

FOREIGN PATENT DOCUMENTS

JP 4763644 B2 8/2011

* cited by examiner

*Primary Examiner* — Khai M Nguyen
(74) *Attorney, Agent, or Firm* — McDermott Will & Emery LLP

(57) ABSTRACT

The analog-to-digital converter includes a quantizer for outputting a quantized signal, a sampling circuit for sampling an analog input signal, a dithering circuit for generating an added voltage, and an integrating circuit for integrating a signal on which the added voltage is superimposed and outputting an integration result to the quantizer. The dithering circuit includes a variable capacitance circuit and a control circuit. The variable capacitance circuit includes a plurality of capacitors. The control circuit controls the capacitance of the variable capacitance circuit to a capacitance smaller than the capacitances of the capacitors, and causes the variable capacitance circuit to generate an added voltage.

20 Claims, 13 Drawing Sheets

US 10,700,693 B2

ANALOG-DIGITAL CONVERTER, SEMICONDUCTOR DEVICE, AND VOLTAGE SIGNAL GENERATION METHOD

CROSS-REFERENCE TO RELATED APPLICATIONS

The disclosure of Japanese Patent Application No. 2018-116150 filed on Jun. 19, 2018 including the specification, drawings and abstract is incorporated herein by reference in its entirety.

BACKGROUND

The present invention relates to an analog-to-digital converter, a semiconductor device, and a voltage signal generating method, for example, an analog-to-digital converter including a micro voltage generating circuit, a semiconductor device including such an analog-to-digital converter, and a voltage signal generating method in the micro voltage generating circuit.

Japanese Patent No. 4763644 (hereinafter, Patent Document 1) discloses a dithering circuit for use in correcting quantization errors in a $\Delta\Sigma$ analog-to-digital converter (ADC: Analog to Digital Converter). The dithering circuit disclosed in Patent Document 1 includes a dither generation circuit for generating a plurality of complementary signal pairs, and a dither injection circuit for generating a plurality of dither signals from the plurality of complementary signal pairs and adding the generated dither signals to an analog input signal. The dither injection circuit has a capacitance provided for each of a plurality of complementary signal pairs. The dither generation circuit controls the switch of the dither injection circuit, and the dither injection circuit inputs the selected capacitance as a dither to the $\Delta\Sigma$ADC. At this time, the dither generating circuit selects a capacitor to be used in accordance with the dither frequency. The capacitance of the dither injection circuit is sufficiently smaller than the sampling capacitance used for sampling the analog input signal, and is, for example, 1/10 or less of the sampling capacitance.

SUMMARY OF THE INVENTION

Recently, in order to increase the speed of the $\Delta\Sigma$ ADC and reduce the power, the sampling capacitance used for sampling the analog input signal in the $\Delta\Sigma$ ADC tends to be small in its capacitance value. Since the dither capacitance used in the dithering circuit is determined by the ratio to the sampling capacitance, the capacitance value of the dither capacitance is also becoming smaller in accordance with the reduction of the sampling capacitance. On the other hand, in order to increase the accuracy of the dither voltage, the capacitance value of the dither capacitance is required to have a high accuracy. However, there has been a problem that it is difficult to realize a capacitance having a small capacitance value and high accuracy.

Other objects and novel features will become apparent from the description of this specification and the accompanying drawings.

SUMMARY

According to one embodiment, the analog-to-digital converter includes a dithering circuit that generates a summed voltage that is superimposed on the signal to be integrated. The dithering circuit includes a capacitor circuit including a plurality of capacitors, and a control circuit for causing the capacitor circuit to generate a summed voltage while controlling a capacitance of the capacitor circuit to a capacitance smaller than a capacitance of a capacitor having a maximum capacitance among the plurality of capacitors.

According to the above-mentioned embodiment, the minute capacitance can be realized with high accuracy.

DETAILED DESCRIPTION

Prior to the description of the embodiments, the matters discussed by the present inventor will be described. Along with an increase in the speed of the system, there is a demand for an increase in the operation speed of the $\Delta\Sigma$ ADC. In order to increase the operation speed of the $\Delta\Sigma$ ADC, it is necessary to reduce the sampling capacity used for sampling the analog input signal in the $\Delta\Sigma$ ADC and to improve the speed of charging and discharging the sampling capacity.

In the $\Delta\Sigma$ ADC, a steady state occurs when the analog input signal is in the vicinity of 0, and a phenomenon occurs in which the digital output signal becomes a constant value. To avoid this phenomenon, a dithering circuit is used. The dithering circuit superimposes a dither signal, which is a small voltage signal, on an analog input signal, and enables the digital signal to exit from a steady state. By superimposing the dither signal on the analog input signal using the dithering circuit, the accuracy of the ΔΣADC can be improved.

Since the dither signal needs a minute amplitude, the dithering circuit needs a minute capacitance for generating a minute voltage. Since the dither signal is also a noise source, the dither signal generated by the dithering circuit needs to have a minimum and appropriate amplitude with respect to the analog input signal. The capacitance of the dithering circuit is designed, for example, on the order of a few tenths of a capacitance value or a few hundredths of a capacitance value compared to the sampling capacitance.

In order to design the capacitance with high accuracy, it is necessary to reduce the local variation. However, the local variation is determined depending on the manufacturing steps and the manufacturing process of the device, and the smaller the required capacity, the larger the influence of the local variation appears. In addition, a device for automobiles or the like includes a circuit block which operates at a high withstand voltage, so that a fine process may not be used in some cases. In the case of a large wiring process, the processing accuracy tends to be rough depending on the process. For this reason, in a device for automobiles or the like, it is difficult to design a fine capacitance value with high accuracy.

Figure 17A:
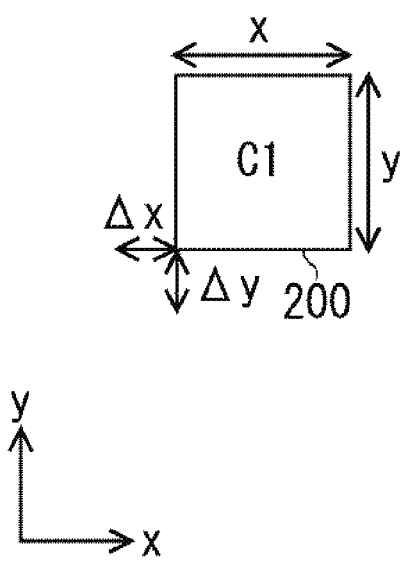
FIGS. 17A and 17B are top views showing plate electrodes used for forming a capacitor.
Figure 17B:
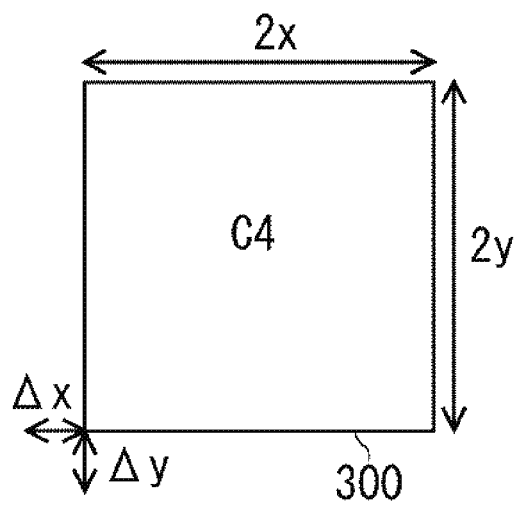

Here, the relationship between the capacitance value of the capacitance formed in the semiconductor device and the manufacturing variation will be described. First, a case is considered in which the parallel plate electrodes are opposed to each other with an insulator interposed therebetween to form a capacitor. FIGS. 17A and 17B are top views of electrodes used for forming a capacitor. FIG. 17A shows a parallel plate electrode 200 formed for realizing a certain capacitance value C1, and FIG. 17B shows a parallel plate electrode 300 formed for realizing a capacitance value C 4 four times as large as C1. As shown in FIG. 17A, it is assumed that the length of the parallel plate electrode 200 in the x direction is x and the length in the y direction is y. As shown in FIG. 17B, it is assumed that the length of the parallel plate electrode 300 in the x direction is 2 x and the length in the y direction is 2 y.

The manufacturing variation is determined according to the process, and even if the size of the parallel plate electrode to be formed is small or large, the variation in the magnitude of the manufacturing variation is the same. When the variation in the magnitude of the manufacturing variation is represented by $\Delta x$ and $\Delta y$, the length of the parallel plate electrode 200 in the x direction is $x+\Delta x$, and the length in the y direction is $y+\Delta y$. The length of the parallel plate electrode 300 in the x direction is $2x+\Delta x$, and the length in the y direction is $2y+\Delta y$.

The capacitance value C1 in the case where the parallel plate electrodes 200 are opposed to each other by the distance L with the insulator interposed therebetween is expressed by the following equation when ε 0 is defined as a dielectric constant of vacuum, εs is defined as a relative dielectric constant of the insulator, and the coefficient A is defined as A=ε 0 εs/L.

$$C1=A(x+\Delta x)(y+\Delta y)=A(xy+x\Delta y+y\Delta x+\Delta x\Delta y)$$

On the other hand, the capacitance value C 4 in the case where the parallel plate electrodes 300 are opposed to each other with a distance L therebetween with an insulator interposed therebetween is expressed by the following equation.

$$C4=A(2x+\Delta x)(2y+\Delta y)=A\{4xy+2(x\Delta y+y\Delta x)+\Delta x\Delta y\}$$

When four capacitances formed by using the parallel plate electrodes 300 are connected in series, the combined capacitance becomes ¼ of the original capacitance, and is the same as the capacitance formed by using the parallel plate electrodes 200 unless manufacturing variations are considered. When the variation is considered, the synthesized capacitance when four capacitances having the capacitance value C 4 represented by the above equation are connected in series is represented by the following equation.

$$C4/4=A\{xy+(x\Delta y+y\Delta x)/2+\Delta x\Delta y/4\}$$

Comparing the above-mentioned composite capacitance with the above-mentioned capacitance value C1, it can be seen that, when four capacitors formed using the parallel plate electrodes 300 of a large size are connected in series, the influence of the fluctuations $\Delta x$ and $\Delta y$ of the magnitude of the fluctuation variation can be reduced as compared with the case of forming the capacitor using the parallel plate electrodes 200 of a small size.

Figure 18A:
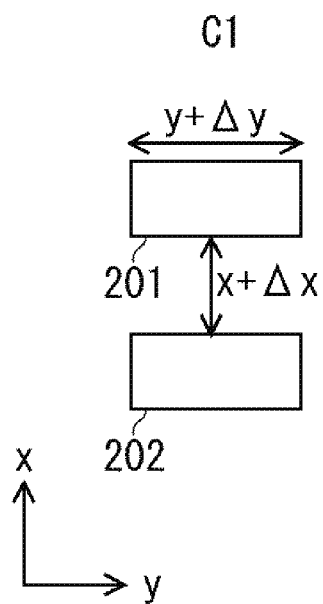
FIGS. 18A and 18B are top views showing wirings used for forming a capacitance between wirings.
Figure 18B:
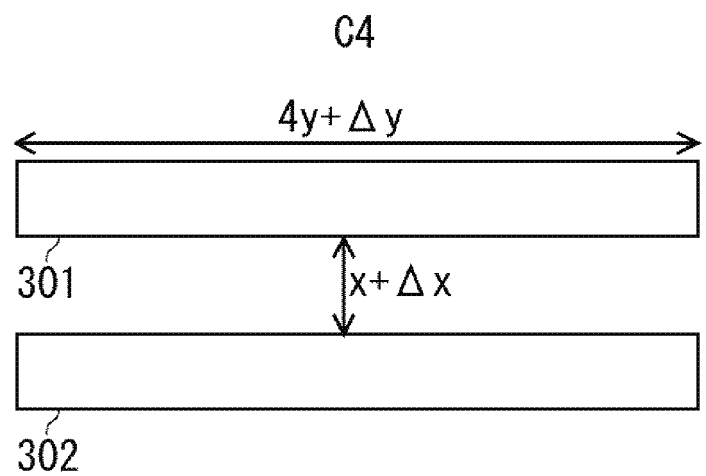

Next, a case will be considered in which, in the same wiring layer of the semiconductor device, a capacitance between wirings is formed by making wirings formed in a comb-tooth shape, for example, face each other. FIGS. 18A and 18B are diagrams of the wiring forming the interconnect capacitance viewed from above. FIG. 18A shows a wiring for realizing an inter-wiring capacitance of the capacitance value C1, and FIG. 18B shows a wiring for realizing an inter-wiring capacitance of the capacitance value C 4 four times as large as C1. Here, for the sake of simplification of description, it is assumed that the capacitance value C1 and the capacitance value C 4 are realized by two wirings that face each other in the same wiring layer.

As shown in FIG. 18A, it is assumed that the length in the y direction of the two wirings 201 and 202 forming the inter-wiring capacitance of the capacitance value C1 is y, and these wirings are formed apart from each other by the distance x. Considering the manufacturing variation, the length of the wirings 201 and 202 in the y direction is $y+\Delta y$, and the distance between the wirings is $x+\Delta x$. As shown in FIG. 18B, it is assumed that the length in the y direction of the two wirings 301 and 302 forming the inter-wiring capacitance of the capacitance value C 4 is 4y, and these wirings are formed apart from each other by the distance x. Considering the manufacturing variation, the length of the wirings 301 and 302 in the y direction is $4y+\Delta y$, and the distance between the wirings is $x+\Delta x$.

When the thickness of the two wiring 201 and 202 is z, ε0 is the dielectric constant of vacuum, and εs is the dielectric constant of the insulator, and the coefficient B is $B=\varepsilon 0 \ominus s \times z$, the capacitive value C1 of the interconnect capacitance formed by the wiring 201 and 202 is expressed by the following equation.

$$C1=B(y+\Delta y)/(x+\Delta x)$$

On the other hand, the capacitance value C 4 of the inter-wiring capacitance formed by the wirings 301 and 302 is expressed by the following equation.

$$C4=B(4y+\Delta y)/(x+\Delta x)$$

When four inter-wiring capacitances formed by the wirings 301 and 302 are connected in series, the combined capacitance becomes ¼ of the original capacitance, and is the same as the inter-wiring capacitance formed by the wirings 201 and 202 unless the manufacturing variation is considered. When the variation is considered, the synthesized capacitance when four capacitances having the capacitance value C 4 represented by the above equation are connected in series is represented by the following equation.

$$C4/4 = B(y+\Delta y/4)/(x+\Delta x)$$

Comparing the above-mentioned composite capacitance with the above-mentioned capacitance value C1, it can be seen that, when four inter-wiring capacitances formed by using the wirings 301 and 302 of a large size are connected in series, the influence of the fluctuations $\Delta x$ and $\Delta y$ of the magnitude of the fluctuation variation can be reduced compared with the case where the inter-wiring capacitances are formed by using the wirings 201 and 202 of a small size. For example, an analogue device for automotive requires a voltage resistance of several 10 V, and it is difficult to create a fine and precise capacity as a problem in the process. Specifically, it is difficult to design each of the plurality of dither capacitors Cd1 to Cdj included in the dither injecting circuitry described in JP-A 1 with micro-capacitance values and accuracy. In some cases, the minimum capacitance value limits defined on the process may not allow the desired small capacitance value to be achieved.

Even if a desired minute capacitance value can be designed in the vicinity of the minimum capacitance value, it is difficult to realize the desired minute capacitance value with high accuracy due to the local variation as described above. In some cases, trimming or the like is performed in order to adjust the dither capacitance to a desired small capacitance value, but there are problems in a method of creating a capacitance value for trimming and problems in that even if a capacitance value for trimming is obtained, the test cost increases. As a result of such examination, the present inventors have come to the following embodiments.

Embodiments to which means for solving the above problems is applied will be described in detail below with reference to the drawings. For clarity of explanation, the following description and drawings are appropriately omitted and simplified. In addition, the elements described in the drawings as functional blocks for performing various processes may be implemented by CPUs (Central Processing Unit), memories, or other circuits when implemented by hardware, and may be implemented by programs loaded into the memories when implemented by software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disks), magneto-optical recording media (e.g., magneto-optical disks), CD-ROM(Read Only Memory)CD-R's, CD-R/W's, and semi-conductor memories (e.g., masked ROM, PROM(Programmable ROM), EPROM (Erasable PROM's, flash ROM's, and RAM's (Random Access Memory). The program may also be supplied to the computer by various types of transitory computer-readable media. Examples of transitory computer-readable media include electrical signals, optical signals, and electromagnetic waves. The temporary computer-readable medium may provide the program to the computer via a priority communication path, such as an electrical wire and an optical fiber, or a wireless communication path.

In the following embodiments, when it is necessary for convenience, the description will be made by dividing into a plurality of sections or embodiments, but except for the case where it is specifically specified, they are not independent of each other, and one of them is related to a modification, an application, a detailed description, a supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, the constituent elements (including the operation steps and the like) are not necessarily essential except for the case in which they are specifically specified, the case in which they are considered to be obviously essential in principle, and the like. Similarly, in the following embodiments, when referring to a shape, a positional relationship, or the like of a component or the like, it is assumed that the shape or the like is substantially approximated or similar to the shape or the like, except for the case where it is specifically specified and the case where it is considered to be obvious in principle. The same applies to the above-mentioned numbers and the like, including the number, the numerical value, the amount, the range, and the like.

First Embodiment

Figure 1:
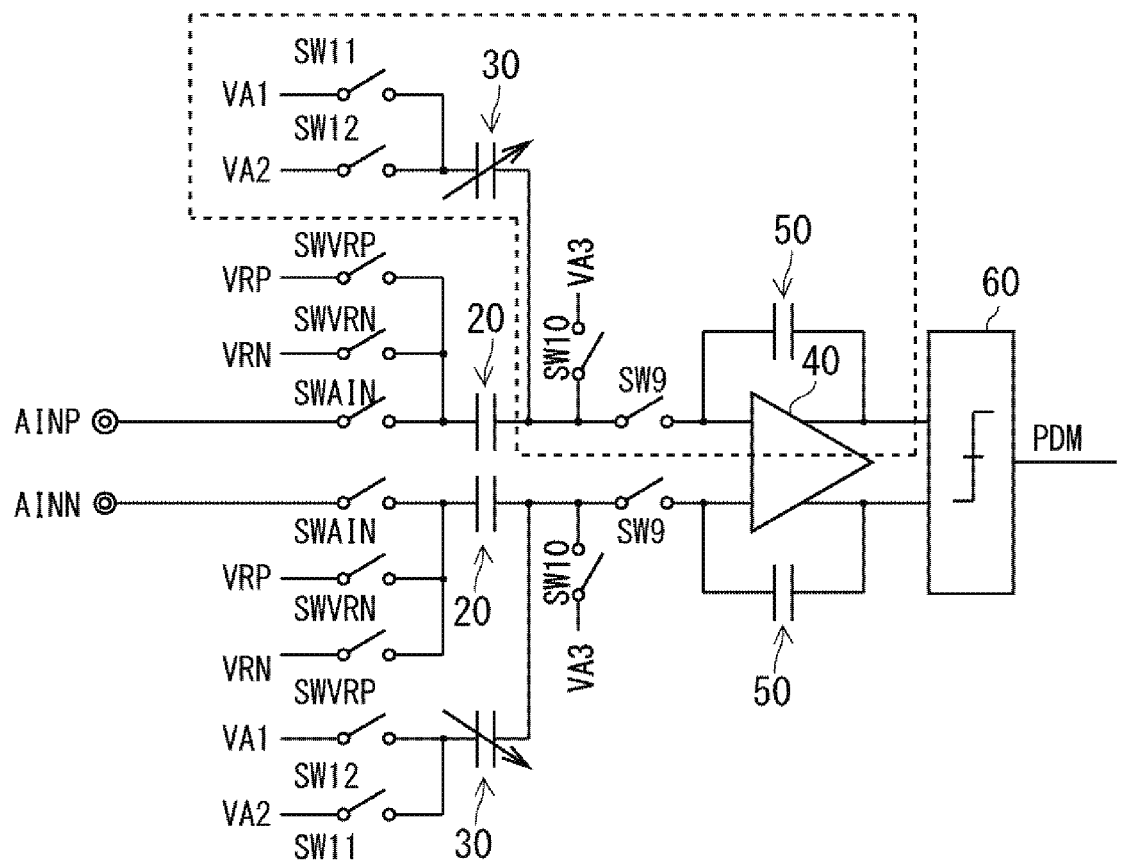
FIG. 1 is a block diagram showing an analog-to-digital converter according to First Embodiment.

FIG. 1 shows an analog-to-digital converter according to a first embodiment. The analog-to-digital converter 10 includes a sampling capacitor 20, a variable capacitance circuit 30, an amplifier 40, an integrating capacitor 50, and a quantizer 60. In FIG. 1, the analog-to-digital converter 10 is configured as an analog-to-digital converter that operates on a differential signal, and has elements on both the analog input signal AINP side and the analog input signal AINN side. The analog-to-digital converter 10 is mounted on a semiconductor device such as an MCU (Micro Controller Unit), for example.

The analog-to-digital converter 10 is configured as a $\Delta\Sigma$ type analog-to-digital converter.

The quantizer 60 quantizes the input signal to 0 or 1 and outputs a quantized signal PDM. The sampling capacitor 20, and the switches SWAIN, the SWVRP, and the SWVRN constitute a switched-capacitor sampling circuit. The sampling circuit samples the analog input signal, and outputs a difference between the sampled analog input signal and a feedback signal corresponding to the quantized signal PDM as a difference signal.

The variable capacitance circuit 30 and the switches SW11 and SW12 constitute a voltage signal generating circuit for generating a minute voltage signal. In the analog-to-digital converter 10, the minute voltage generating circuit is used as a dithering circuit for superimposing an added voltage (dither voltage) on a difference signal output from the sampling circuit. The amplifier 40 and the integration capacitor 50 constitute an integration circuit for integrating the difference signal on which the dither voltage is superimposed.

One end (input side) of the sampling capacity 20 is connected to the analog input signal AINP via a switch SWAIN and to the reference voltages VRP and VRN via a switch SWVRP and SWVRN. The other end of the sampling capacitor 20 is connected to the reference voltage VA3 through a switch SW10, and is connected to the amplifier 40 and the integration capacitor 50 through a switch SW9.

One end (input-side) of the variable capacitance circuit 30 is connected to the reference voltages VA1 and VA2 via switches (voltage changeover switches) SW11 and SW12. The other end of the variable capacitance circuit 30 is connected to the output side of the sampling capacitor 20. The variable capacitance circuit 30 is configured to be switchable so that the capacitance value can be adjusted in accordance with the frequency for controlling the dither and the surrounding environment. The capacitance value of the variable capacitance circuit 30 is set to, for example, a value equal to or less than 1/10 or equal to or less than 1/100 of the capacitance value of the sampling capacitor 20.

The analog input signal AINP is sampled by the sampling capacitor 20 while the switches SWAIN and SW10 are controlled to be on and the switch SW9 is controlled to be off.

During the sampling period, charges corresponding to the voltage difference between the analog input signal AINP and the reference signal VA3 are accumulated in the sampling capacitor 20. At this time, in the dithering circuit, one of the switches SW11 and SW12 is controlled to be turned on, and charges corresponding to the voltage difference between the reference voltage VA1 or VA2 and the reference voltage VA3 are accumulated in the variable capacitance circuit 30. The same applies to the analogue input-signal AINN.

When the sampling is completed, the switch SWAIN and the switch SW10 are controlled to be turned off, and one of the switches SWVRP and the switch SWVRN is controlled to be turned on. Which of the switch SWVRP and the switch SWVRN is controlled to be turned on is determined based on the previous quantization result in the quantizer 60. The sampling capacitor 20 outputs a difference signal between the sampled signal and the reference voltage VRP or VRN. In the dithering circuit, on and off of the switches SW11 and SW12 are inverted, and the variable capacitance circuit 30 adds the dither voltage to the difference signal outputted from the sampling capacitor 20.

Here, the reference voltages VA1 and VA2 are switched between the reference voltage VRP and the voltage VRN at predetermined intervals, for example. The switching frequency of the voltages of the reference voltages VA1 and VA2 is also referred to as the dither frequency. When the reference voltage VA1 is the reference voltage VRP, the reference voltage VA2 is the reference voltage VRN, and when the reference voltage VA1 is the reference voltage VRN, the reference voltage VA2 is the reference voltage VRP. The reference voltage VA3 is set to, for example, a voltage intermediate between the reference voltage VRP and the reference voltage VRN. The reference voltage VA3 is not limited to a voltage intermediate between the reference voltage VRP and the reference voltage VRN, and may be any voltage.

The charges accumulated in the sampling capacitor 20 and the variable capacitance circuit 30 at the time of sampling are transferred to the integration capacitor 50 through the switched SW9 which is turned on. The integrating circuit composed of the amplifier 40 and the integrating capacitor 50 integrates the difference signal on which the dither voltage is superimposed, and outputs the integrated signal. The quantizer 60 quantizes the integrated signal output from the integrating circuit. The quantizer 60 compares, for example, a predetermined voltage with the integrated signal, and quantizes the integrated signal into a 1-bit quantized signal PDM based on the comparison result. The quantized signal PDM output from the quantizer 60 is not limited to one bit, and the quantizer 60 may output a quantized signal PDM of a plurality of bits.

Dithering Circuit

Figure 2:
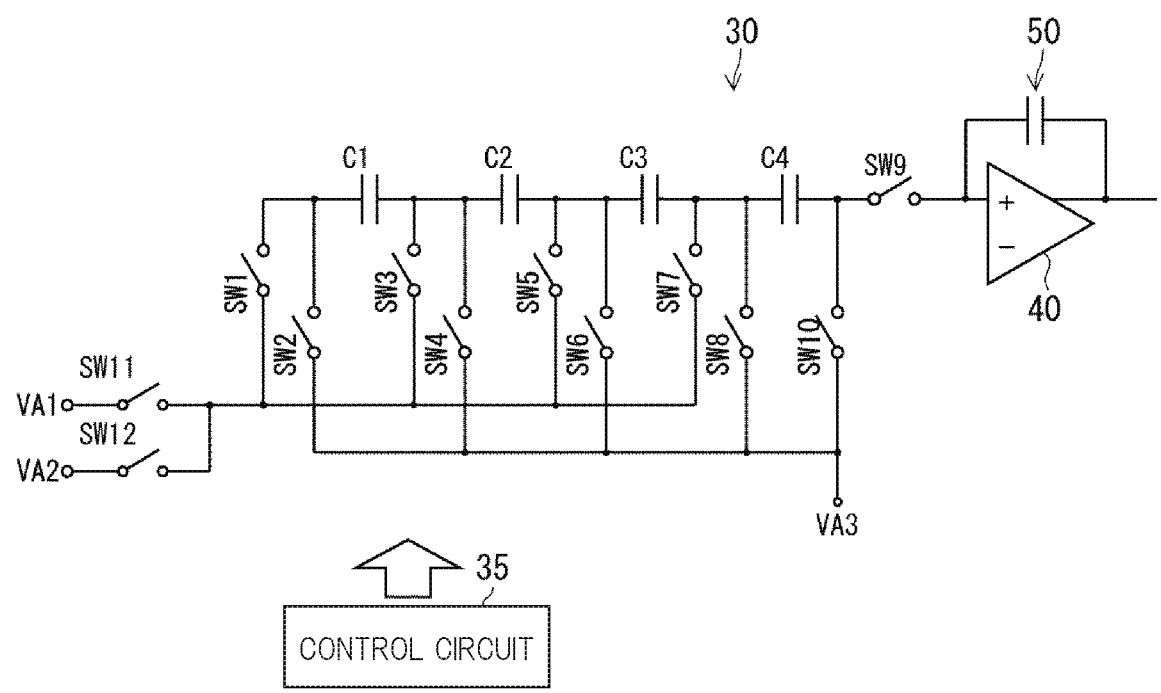
FIG. 2 is a block diagram showing a configuration example of the dithering circuit.

FIG. 2 shows a configuration example of the dithering circuit. The components shown in FIG. 2 correspond to the elements of the portion enclosed by the dotted line in FIG. 1. The dithering circuit includes switches SW11 and SW12, a variable capacitance circuit 30, and a control circuit 35. The variable capacitance circuit 30 includes a plurality of capacitors. In the example of FIG. 2, the variable capacitance circuit 30 includes four capacitors C1 to C 4. Each capacitor is formed in a semiconductor device using, for example, two electrodes opposed to each other with a dielectric layer interposed therebetween. Alternatively, in the semiconductor device, each capacitor is formed using an inter-wiring capacitance in the same wiring layer. The variable capacitance circuit 30 may include a plurality of capacitors, and the number of capacitors is not limited to four.

In the variable capacitance circuit 30, the four capacitors C1 to C 4 are connected in series between an input node connected to the switches SW11 and SW12 and an output node connected to the switch SW9. The capacitances of the capacitors C1 to C 4 may be equal to or different from each other. In the variable capacitance circuit 30, since the plurality of capacitors C1 to C 4 are connected in series, the combined capacitances of the four capacitors are smaller than the capacitances of the individual capacitors.

The variable capacitance circuit 30 includes switches SW1, a SW3, a SW5, and a 7SW disposed between the input node and the input node of each of the input node terminals of the plurality of capacitors C1 to C 4. In addition, the variable capacitance circuit 30 comprises switches SW2, a SW4, a SW6, and a SW8 which are arranged between a terminal of the reference voltage VA3 and input node side terminals of the capacitors C1 to C 4 respectively.

In FIG. 2, the switches SW2, the switches SW4, the switches SW6, and the switches SW8 are connected to the terminal of reference voltage VA3, but the switches SW2, SW4 and SW6 are not limited to connect to the terminal of reference voltage VA3. The switches SW2, the switches SW4, the switches SW6, and the switches SW8 may be connected to any initialization voltages.

For example, when the reference voltage VA1 or VA2 is used as the initialization voltage, the switches SW2, the switches SW4, the switches SW6, and the switches SW8 may be arranged between a terminal of the reference voltage VA1 or VA2 and the input-node-side terminals of the capacitors C1 to C 4 respectively.

The controller 35 controls the switches SW1-SW12. The control circuit 35 makes on one of the switches SW11 and SW12 on and other of the switches SW11 and SW12 off with the sampling period in which the analog input signal is sampled by the sampling capacitor 20. In the sampling period, the control circuit 35 makes the switch SW9 off and the switch SW10 on. The control circuit 35 makes on the other of the switches SW11 and SW12 on and the one of the switches SW11 and SW12 off during the integration period in which integration is performed in the integration circuit. In addition, the control circuit 35 makes the switch SW10 off and the switch SW9 on during the integration period.

In the following explanation, the switch SW11 is turned on and the switch SW12 is turned off in the sampling period. In addition, the switch SW12 is turned on and the switch SW11 is turned off in the integration period.

The control circuit 35 changes the capacitance of the variable capacitance circuit 30 through the control of the switch. In the present embodiment, the control circuit 35 makes the variable capacitance circuit 30 to generate an additional voltage which is called a dither voltage while controlling the capacitance of the circuit 30 to keep it smaller than the biggest capacitance of the plurality of capacitors C1 to C 4.

In particular, in the present embodiment, the control circuit 35 causes the variable capacitance circuit 30 to generate a dither voltage using a predetermined number of capacitors among the plurality of capacitors C1 to C 4 connected in series. In the sampling period, the control circuit 35 makes a predetermined number of capacitors to sample a differential voltage which is the difference between the third reference voltage VA3 and one of the second reference voltage VA2 and the first reference voltage VA1 which is inputted from the input node of the capacitance circuit.

In the integration period, the control circuit 35 makes the predetermined numbers of capacitors used for sampling output the dither voltage (additional voltage) corresponding to the predetermined voltage within the integration period.

More specifically, in the integration period, the control circuit 35 makes the predetermined numbers of capacitors output the additional voltage corresponding to the other of first reference voltage VA1 and the second reference voltage VA2.

The control circuit 35 turns on any one of the switches SW1, the SW3, the SW5, and the SW7, thereby controlling the number of capacitors used for generating the dithering voltage. For example, when two capacitors are used to generate the dither voltage, the control circuit 35 turns on a switch SW5 connected to a terminal on the input node side of the second capacitor as viewed from the output node side, among the switches SW1, the SW3, the SW5, and the SW7. The control circuit 35 turns off the remaining switches.

In general, when n is an integer of describing number of the capacitors which are used for generating the additional voltage, the control circuit makes the capacitor changing switches arranged between the input node and input node side terminal of the capacitor that is n order which is count number of the capacitor from the most input node side on, and making other remaining capacitors changing switches off, within both the sampling period and integration period. In this case, if the capacitances of the plurality of capacitors are all C, the combined capacitance of the capacitors used for generating the dither voltage is C/n.

At the start of the operation, the control circuit 35 may perform an initialization operation to apply an initial voltage to the four capacitors C1 to C 4. In the initialization operation, the control circuit 35 turns on the switches SW2, the SW4, the SW6, and the SW8, and the switch SW10. When these switches are turned on, the voltages of the terminals on the input node side and the terminals on the output node side of the capacitors C1 to C 4 become the reference voltage VA3. When a plurality of capacitors are simply connected in series, there is a problem that the potential of the node between the capacitors cannot be determined. For example, by connecting the nodes between the capacitors to an arbitrary voltage at the start of operation, the potential of the nodes between the capacitors can be determined and protected from device breakdown.

Operation Procedure

Figure 3:
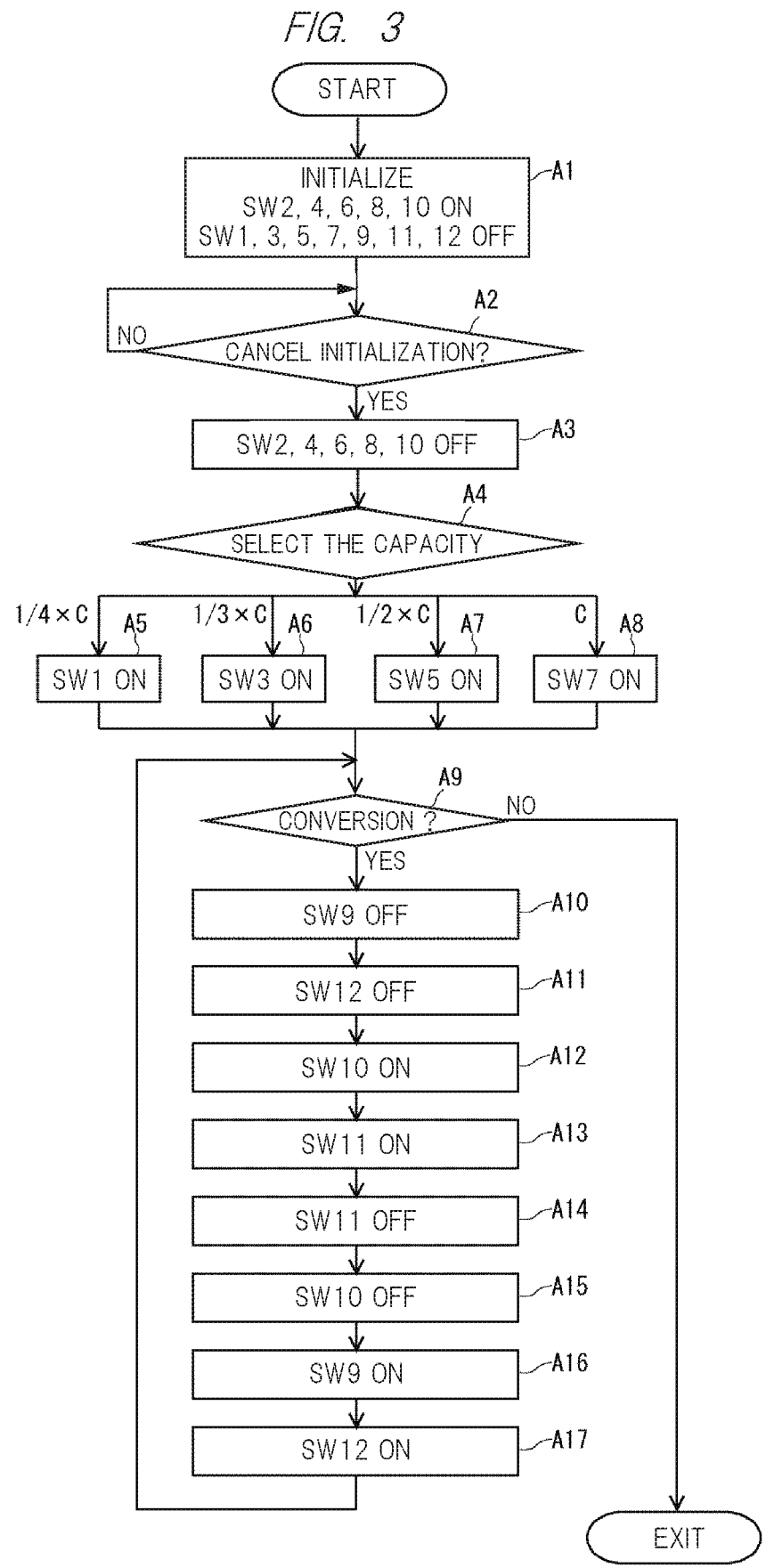
FIG. 3 is a flowchart showing an operation procedure.

FIG. 3 shows an operation procedure. The control circuit 35 initializes the potentials of the capacitors C1 to C 4. In step A1, the control circuit 35 turns on the switch SW2, SW4, SW6, SW8, and SW10 and turns off the switch SW1, SW3, SW5, SW7, SW9, SW11, and SW12. In step A 2, the control circuit 35 determines whether to cancel the initialization (step A 1). The control circuit 35 determines that the initialization is canceled or not (step A2). For example, the control circuit 35 determines that the initialization is canceled when a predetermined time has elapsed after turning on the switches SW2, SW4, SW6, SW8, and SW10. The control circuitry 35 turns off the switches SW2, SW4, SW6, SW8, and SW10 when it is determined that the initialization is to be released (step A3).

Figure 4:
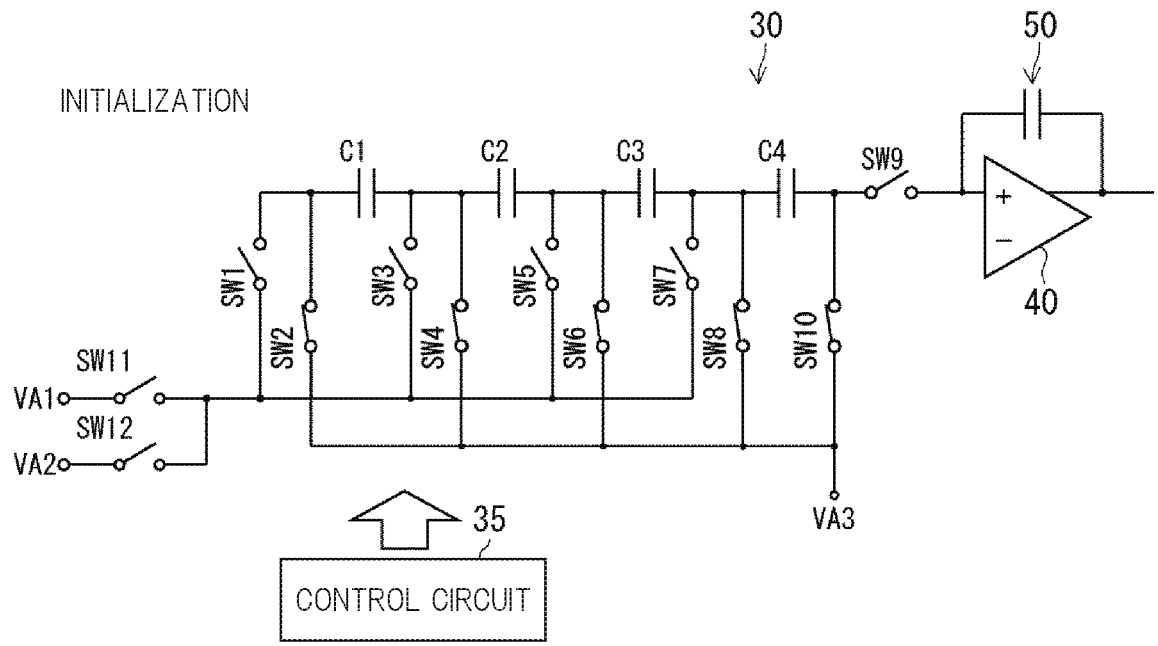
FIG. 4 is a block diagram showing a dithering circuit at the time of initialization.

FIG. 4 shows the dithering circuit during initialization. When the switches SW2 and SW4, the SW6, the SW8, and the SW8 are turned on, the potentials of the nodes between the neighboring capacitors become the reference voltages VA3. By doing so, a predetermined potential can be applied to the node between the four capacitors C1 to C 4 connected in series, and generation of an excessive voltage can be prevented. In the initialization operation, the switch SW11 or SW12 may be turned on, and the switches SW1, the SW3, the SWS, and the SW7 may be turned on to apply the reference voltages VA1 or VA2 to the nodes between the four capacitors C1 to C 4. The switches SW2, the SW4, the SW6, and the SW8 may be omitted.

Referring back to FIG. 3, the control circuit 35 determines the capacitance of the variable capacitance circuit 30 (step A4). In step A 4, the control circuit 35 determines whether the capacitance value of the variable capacitance circuit 30 is C/4, C/3, C/2, or C by referring to, for example, a register (not shown in FIG. 2). It is assumed that the register stores information indicating the capacitance value at which the variable capacitance circuit 30 is operated in accordance with the type of the analog input signal to be sampled, the usage environment of the analog-to-digital converter 10, and the like.

When it is determined that the capacitance of the variable capacity circuit 30 is C/4, the control circuit 35 turns on the switching SW1 (step A5). When it is determined that the capacitance of the variable capacity circuit 30 is C/3, the control circuit 35 turns on the switching SW3 (step A6). When the control circuit 35 determines that the capacitance of the variable capacity circuit 30 is C/2, the switch SW5 is turned on (step A7). When the control circuit 35 determines that the capacitance of the variable capacity circuit 30 is C, it turns on the switching SW7 (step A8).

The control circuit 35 determines whether conversion into a digital signal is to be performed (step A 9). When it is determined that the conversion is performed in step A9, the control circuit 35 turns off the switch SW9 (step A10), turns off the switch SW12 (step A11), turns on the switch SW10 (step A12), and turns on the switch SW11 (step A13). In this manner, the charge corresponding to the differential voltage between the reference voltage VA1 and the reference voltage VA3 is stored in a predetermined number of capacitors of the four capacitors C1-C4. Note that steps A 10 to A 13 are not necessarily performed in the order shown in FIG. 3, and the order may be slightly back and forth.

The control circuit 35 waits until the sampling period expires, and when the sampling period expires, the switch SW11 is turned off (step A14), the switch SW10 is turned off (step A15), the switch SW9 is turned on (step A16), and the switch SW12 is turned on (step A17). In this manner, charges accumulated in a predetermined number of capacitors during the sampling period are transferred to the integrating circuit through the switched SW9 which is turned on during the sampling period. Steps A 14 to A 17 do not necessarily have to be performed in the order shown in FIG. 3, and the order may be somewhat back and forth.

The control circuit 35 returns to step A 9 to determine whether or not to continue the conversion. The control circuit 35 repeatedly performs steps A 10 to A 17 until it is determined in step A 9 that the conversion is not to be performed. When it is determined that the conversion is not performed in step A9, the control circuit 35 terminates the processing.

Operation Example 1

Figure 5:
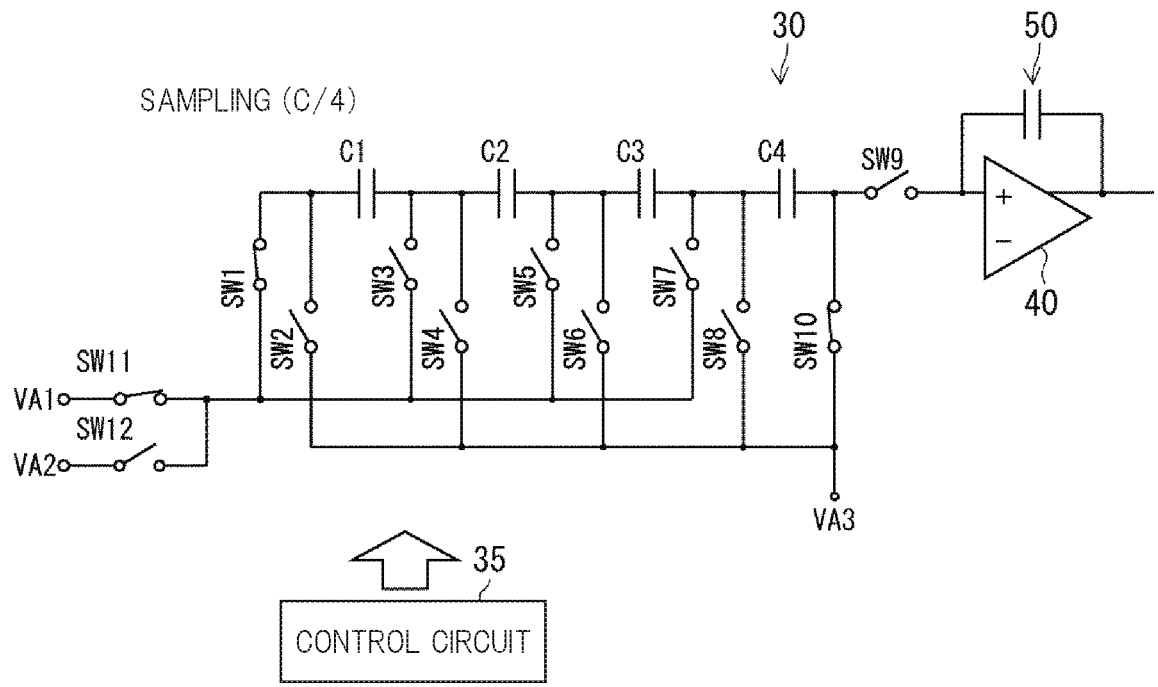
FIG. 5 is a block diagram showing the dithering circuit in the sampling period.

FIG. 5 shows the dithering circuit in the sampling period when the capacitance of the variable capacitance circuit 30 is C/4. When the capacitance is C/4, the control circuit 35 turns on the switching SW1 in step A 5 of FIG. 3. At this time, the switches SW3 and SW5 and the switch SW7 are turned off. During the sampling period, the control circuit 35 turns off the switches SW9 and SW12 and turns on the switches SW10 and SW11 in steps A 10 to A 13. In this instance, the differential voltage between the reference voltage VA1 and the reference voltage VA3 is sampled by the four capacitors C1 to C 4. Since the combined capacitance of the four capacitors is C/4, a charge equivalent to sampling with one capacitor having a capacitance of ¼ of the individual capacitance is stored in each capacitor.

Figure 6:
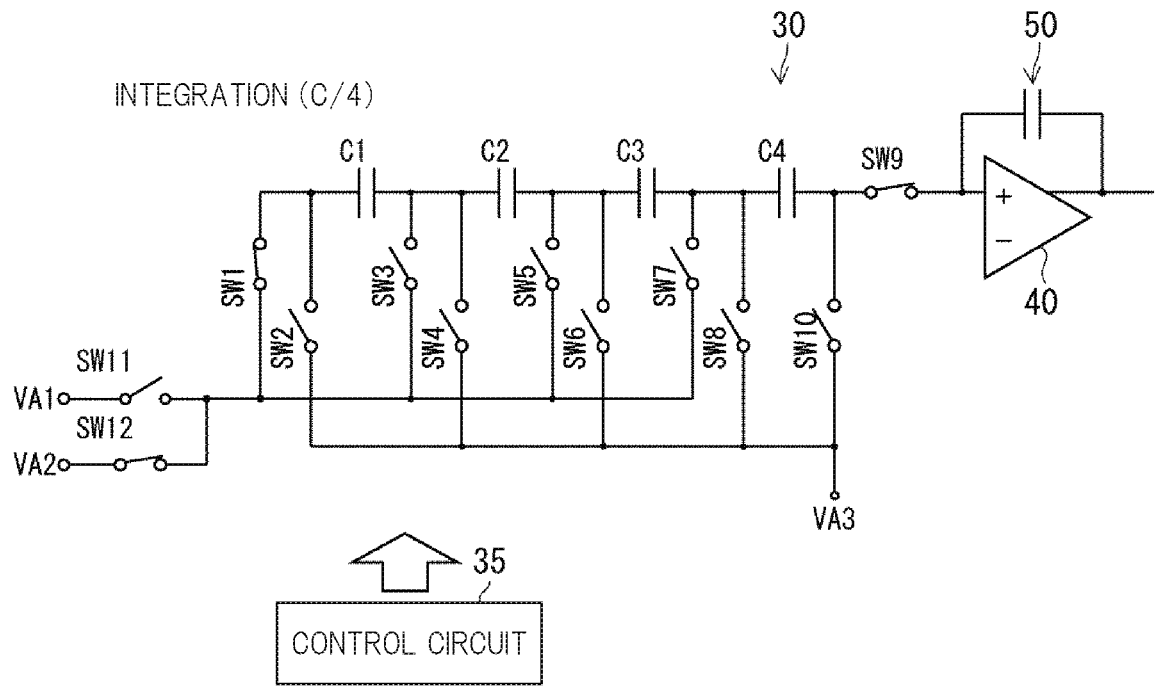
FIG. 6 is a block diagram showing the dithering circuit in the integration period.

FIG. 6 shows the dithering circuit in the integration period when the capacitance of the variable capacitance circuit 30 is C/4. The control circuit 35 turns off the switches SW10 and SW11 and turns on the switches SW9 and SW10 in steps A 14 to A 17 during the integration period. When the switching SW9 is turned on, charges accumulated in the four capacitors C1 to C 4 in the sampling period are transferred to the integration circuit. The control circuit 35 alternately performs the control of the switch shown in FIG. 5 and the control of the switch shown in FIG. 6, whereby the sampling using the four capacitors connected in series and the transfer of the sampled charge to the integrating circuit are alternately performed.

Operation Example 2

Figure 7:
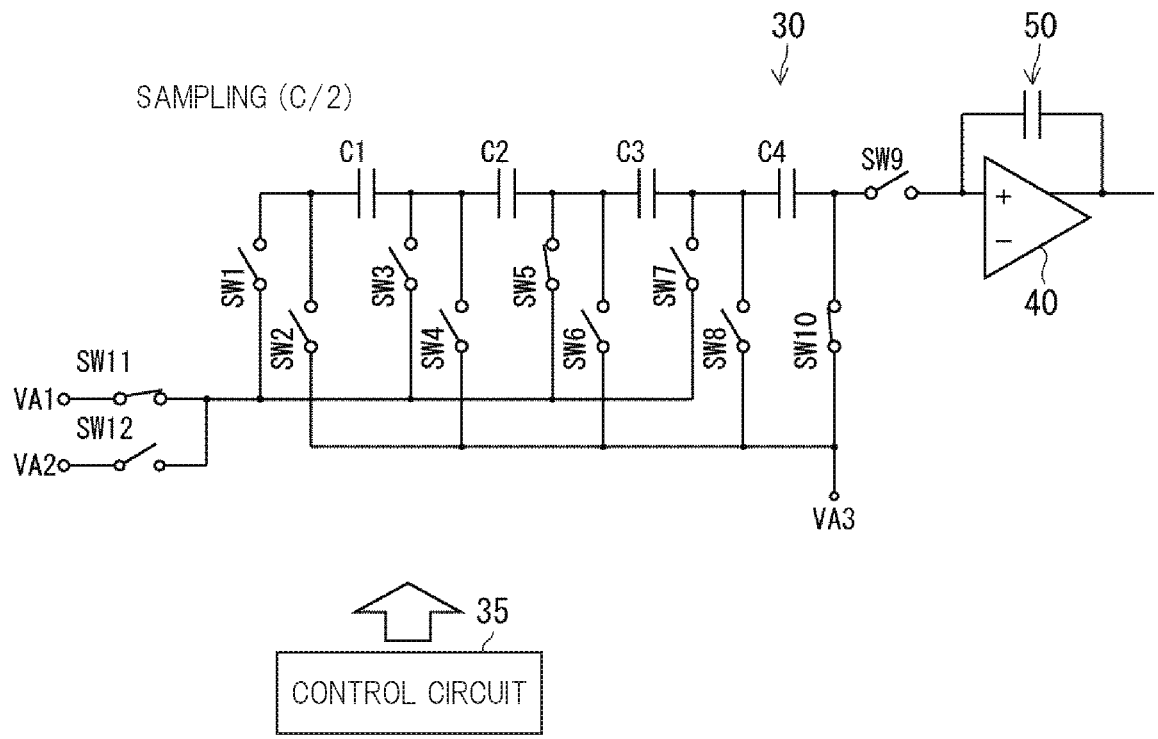
FIG. 7 is a block diagram showing the dithering circuit in the sampling period.

FIG. 7 shows the dithering circuit in the sampling period when the capacitance of the variable capacitance circuit 30 is C/2. When the capacitance is C/2, the control circuit 35 turns on the switching SW5 in step A 7 of FIG. 3. At this time, the switches SW1 and SW3 and the switch SW7 are turned off. During the sampling period, the control circuit 35 turns off the switches SW9 and SW12 and turns on the switches SW10 and SW11 in steps A 10 to A 13. In this instance, the difference voltage between the reference voltage VA1 and the reference voltage VA3 is sampled in the two capacitors C3 and C 4. Since the combined capacitance of the two capacitors is C/2, a charge equivalent to sampling with one capacitor having a capacitance of ½ of the individual capacitance is stored in each capacitor. Since the capacitors C1 and C2 are not used for sampling, the controller 35 may turn on one or both of the switches SW1 and SW3.

Figure 8:
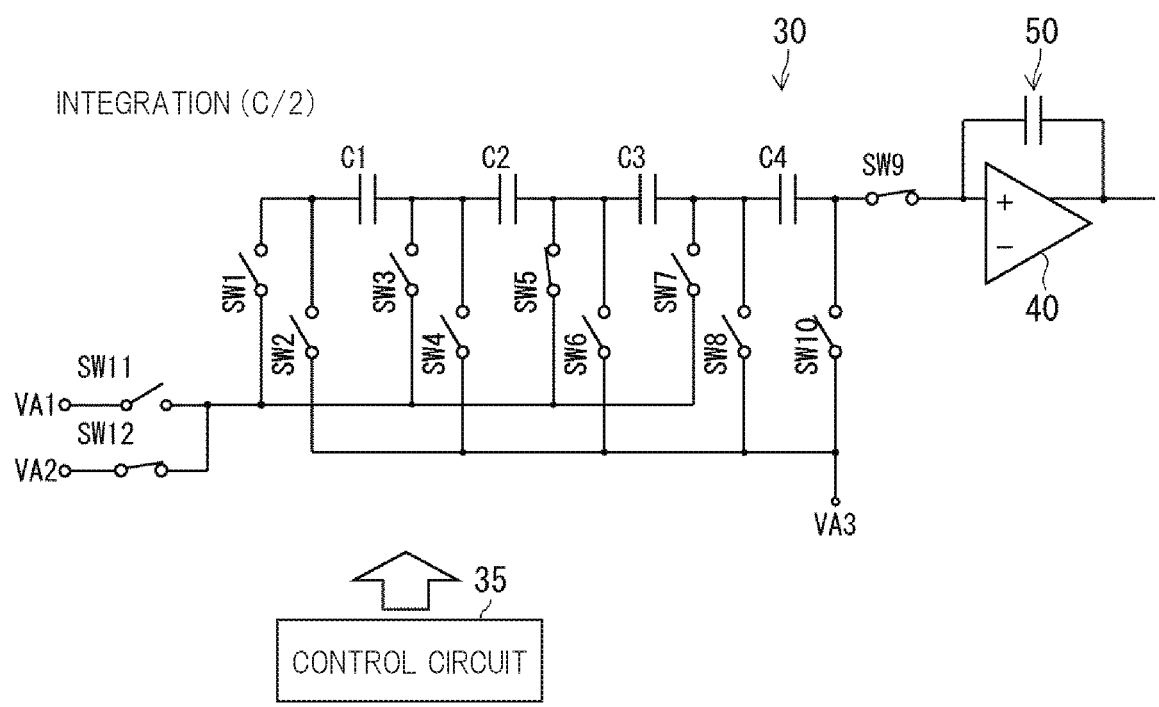
FIG. 8 is a block diagram showing the dithering circuit in the integration period.

FIG. 8 shows the dithering circuit in the integration period when the capacitance of the variable capacitance circuit 30 is C/2. The control circuit 35 turns off the switches SW10 and SW11 and turns on the switches SW9 and SW10 in steps A 14 to A 17 during the integration period. When the switching SW9 is turned on, charges accumulated in the two capacitors C3 and C 4 in the sampling period are transferred to the integrating circuit in the sampling period. The control circuit 35 alternately performs the control of the switch shown in FIG. 7 and the control of the switch shown in FIG. 8, whereby the sampling using the two capacitors connected in series and the transfer of the sampled charge to the integrating circuit are alternately performed.

Example Operation Waveform

Figure 9:
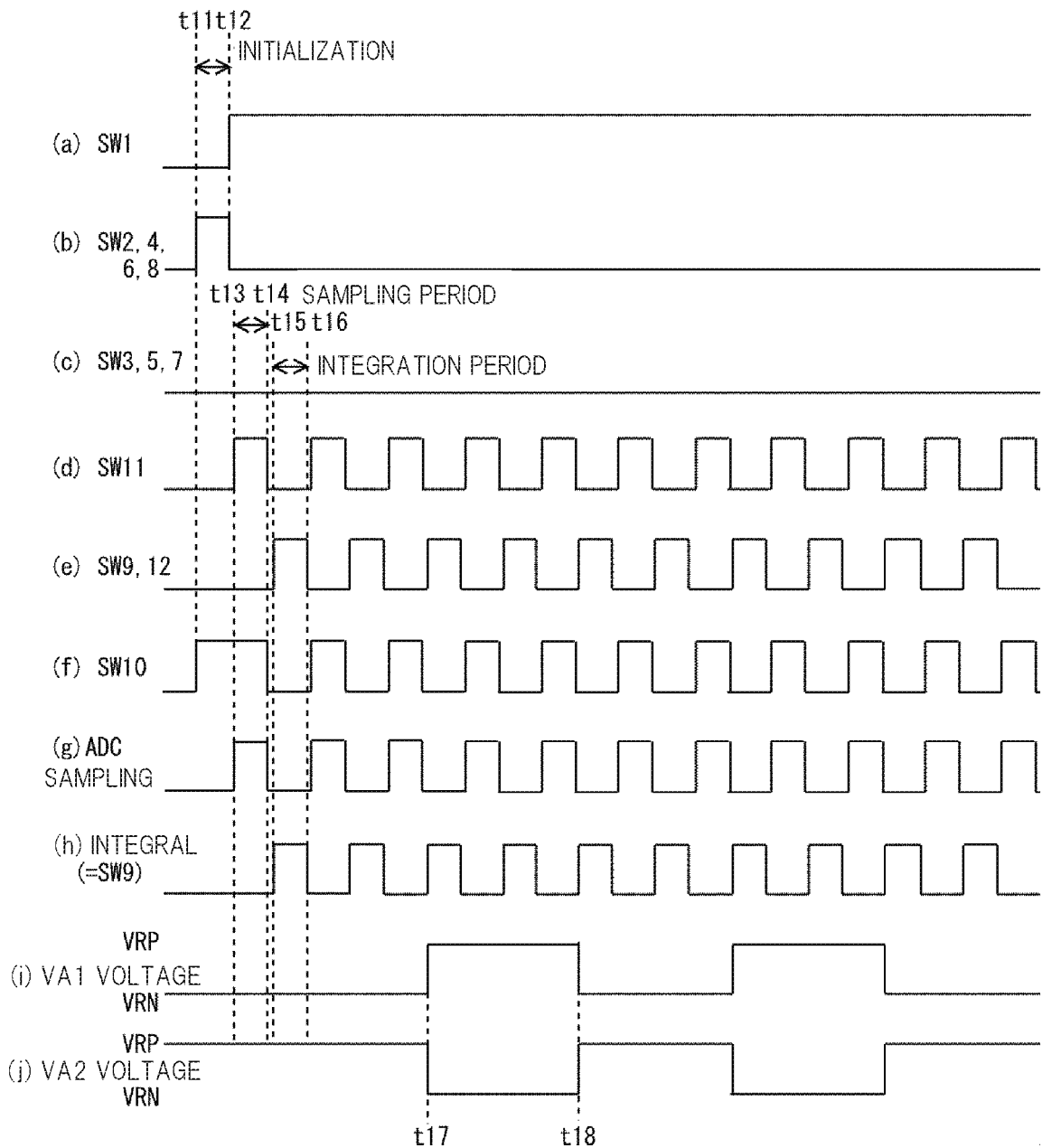
FIG. 9 is a timing chart showing an example of operation waveforms of the respective units.

FIG. 9 shows an example of operation waveforms of the respective units. Here, it is assumed that the capacitance of the variable capacitance circuit 30 is controlled to C/4. In the exemplary operation waveforms shown in FIG. 9, the H (High) level of the signal corresponds to switch-on, and the L (Low) level of the signal corresponds to switch-off. Conversely, the L level of the signal may correspond to switch-on and the L level may correspond to switch-on.

At time t 11, the control circuit 35 turns on the switches SW2, the SW4, the SW6, and the SW8 and the switch SW10 from the off-state (see (b) and (f)). Thereafter, the control circuit 35 releases the initialization at time t12 and turns the switch SW2, SW4, SW6, and SW8 on and off (see (b)). After the initialization is released, the control circuit 35 turns on the switch SW1 from the off-state in step A 5 (see (a)).

At time t 13, the controller 35 turns the switch SW11 from OFF to ON (see (d)), leaves the switches SW9 and SW12 OFF (see (e)), and leaves the switch SW10 ON (see (f)). At time t 13, the reference voltage VA1 is the reference voltage VRN, and the reference voltage VA2 is the reference voltage VRP (see (i) and (j)). At this time, the sampling capacitor 20 (see FIG. 1) samples the analog input signal (see (g)). When the sampling period ends at time t 14, the control circuit 35 turns on and off the switch SW11 and the switch SW10 (see (d) and (f)). At this time, sampling of the analog input signal in the sampling capacitor 20 is also finished (see (g)).

After the sampling period ends, the control circuit 35 turns off the switches SW9 and SW12 to on at time t 15 (see (e)), and causes the integration circuit composed of the amplifier 40 and the integration capacitor 50 to perform integration (see (h)). When the integration period ends at time t 16, the control circuit 35 turns on and off the switches SW9 and SW12 (see (e)). The integrating circuit stops the integrating operation when the switching SW9 is turned off (see (h)).

Thereafter, similarly, the operation of the sampling period from the time t 13 to the time t 14 and the operation of the integration period from the time t 15 to the time t 16 are alternately performed. The reference voltages VA1 and VA2 are switched between the reference voltage VRP and the reference voltage VRN, for example at a frequency twice the sampling frequency. In FIG. 9, at time t 17, the reference voltage VA1 is switched from the reference voltage VRN to the reference voltage VRP (see (i)), and at time t 18, the reference voltage VA2 is switched from the reference voltage VRP to the reference voltage VRN.

Summary

In the present embodiment, the variable capacitance circuit 30 includes a plurality of capacitors connected in series between an input node and an output node. The control circuit 35 generates a dither voltage using a predetermined number of capacitors among the plurality of capacitors connected in series. In this manner, the variable capacitance circuit 30 can be controlled to have a capacitance value smaller than the capacitance of each capacitor. For example, when the capacitance of the four capacitors C1 to C 4 is C, the capacitance of the variable capacitance circuit 30 can be controlled to C/4, C/3, C/2, or C by controlling the switches SW1, SW3, SW5, and SW7.

In the present embodiment, the capacitance of the variable capacitance circuit 30 can be changed by selecting which one of the switches SW1, the SW3, the SW4, and the SW7 is turned on. For example, if the noise is small and therefore a larger dither voltage is required, the capacitance of the variable capacitance circuit 30 can be increased to generate a dither voltage of a desired magnitude. When it is not necessary to intentionally add noise, for example, when the noise is relatively large or when the variation of the analog input signal is large, the capacitance of the variable capacitance circuit 30 can be reduced to lower the dither voltage which is also noise.

In the present embodiment, a capacitor having a capacitance larger than that of the minute capacitance to be realized is used. When a minute capacitance is formed in a semiconductor device, the ratio of local variation with respect to a desired capacitance value becomes high, and it is difficult to realize the minute capacitance with high accuracy. In particular, in the case of the inter-wiring capacitance, the distance between the wirings corresponding to the distance between the electrodes forming the capacitance varies, and the amount of change in the capacitance due to the variation is large. In the present embodiment, the minute capacitance is realized by using a plurality of capacitors connected in series, and the influence of local variation can be reduced as compared with the case where the minute capacitance is formed in the semiconductor device.

For example, when four capacitors C1-C 4 connected in series are used to generate the dither voltage (see FIGS. 5 and 6), the local variation in the combined capacitance can be reduced to ¼ of the local variation of each capacitor. When two capacitors C3 and C 4 connected in series are used to generate the dither voltage (see FIGS. 7 and 8), the local variation in the combined capacitance can be reduced to ½ of the local variation of each capacitor. As described above, in the present embodiment, the minute capacitance can be realized with high accuracy. In the present embodiment, since the minute capacitance can be realized with high accuracy, the dither voltage can be accurately controlled to a desired minute voltage. Further, in the present embodiment, since a minute capacity can be realized without using a minute process, it is possible to design a minute capacity even in a process having a high withstand voltage such as an in-vehicle analog.

Here, when adjusting the capacity of the dither capacity by performing trimming, trimming needs to be performed for each sample, which increases the test cost. In addition, when trimming is performed, circuits related to trimming such as a register and an efuse need to be mounted on the semiconductor device, which increases costs accordingly. In the present embodiment, since the minute capacitance can be realized with high accuracy, it is not necessary to perform trimming. Therefore, the cost can be reduced as compared with the case where trimming is performed.

In the present embodiment, the capacitance of each capacitor included in the variable capacitance circuit 30 is larger than the minute capacitance to be realized. Therefore, the influence of noise can be reduced as compared with the case where one capacitor having a small capacitance is used. Further, in the present embodiment, since the capacitance of each capacitor can be made relatively large, there is also an advantage that the influence of the parasitic capacitance of each switch can be reduced as compared with the case where one capacitor having a small capacitance is used for the variable capacitance circuit 30. In the present embodiment, a plurality of capacitors are used in order to realize the minute capacitance, and the area of the portion of the variable capacitance circuit 30 is increased as compared with the case where one capacitance is formed in the semiconductor device. However, the parallel plate electrodes and the capacitance between the wirings can be formed in an empty space in the AD conversion circuit, or in an empty portion where a processor, a memory, or the like is not arranged, and even if a plurality of capacitors are formed, the impact on enlarging the area is small.

Second Embodiment

Figure 10:
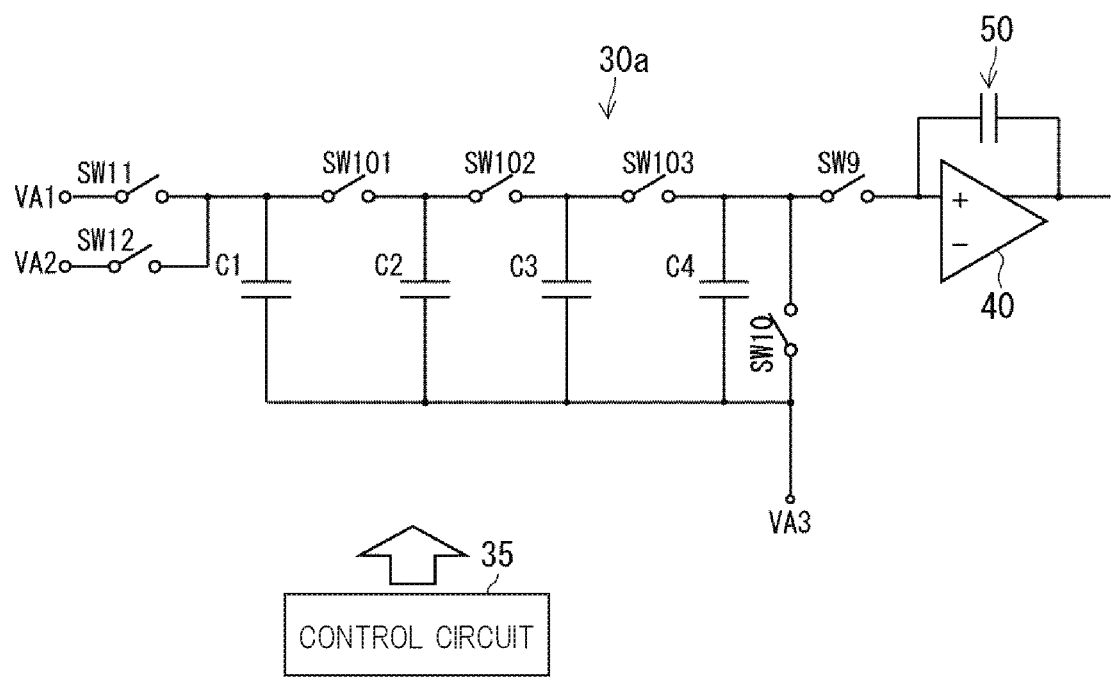
FIG. 10 shows a Block diagram of dithering circuit used in the analog-to-digital converter according to the second embodiment.

Next, Second Embodiment will be described. FIG. 10 shows a dithering circuit used in the analog-to-digital converter according to the second embodiment. The configuration of the analog-to-digital converter according to the present embodiment may be the same as the configuration of the analog-to-digital converter 10 according to the first embodiment shown in FIG. 1. The dithering circuit used in the present embodiment includes a variable capacitance circuit 30a. The variable capacitance circuit 30a includes a plurality of capacitors C1 to C 4 and a switching SW101~SW103. Although FIG. 10 shows an example in which the variable capacitance circuit 30a includes four capacitors, the number of capacitors is not particularly limited.

In the variable capacitance circuit 30a, the four capacitors C1 to C 4 are connected in parallel between the input node and the reference voltage VA3. The switching SW101~SW103 is inserted between wirings connected to the input nodes and interconnecting one ends of the plurality of capacitors C1 to C 4. The switch SW101~SW103 is used as a parallel number control switch for controlling the parallel number of capacitors.

In the present embodiment, the control circuit 35 causes a predetermined number of capacitors among a plurality of capacitors connected in parallel to sample a predetermined voltage. The control circuitry 35 turns on one of the switches SW11 and SW12 and off the other in sampling for a predetermined voltage. The controller 35 turns off the switch SW9 and turns on the switch SW10. The control circuit 35 turns off the switch SW101 when sampling a predetermined voltage to one capacitor. In this manner, charges corresponding to the difference voltage between one of the reference voltage VA1 and the reference voltage VA2 input from the input nodes and the third reference voltage can be accumulated in the capacitor C1. Also in the present embodiment, as in the first embodiment, the reference voltages VA1 and VA2 are switched between the reference voltage VRP and the voltage VRN in predetermined cycles, for example.

When the two capacitors sample predetermined voltages, the control circuit 35 turns on the switch SW101 and turns off the switch SW102. In this instance, the capacitors C1 and C2 are connected to the input node, and charges corresponding to the difference voltage between one of the reference voltage VA1 and the reference voltage VA2 input from the input node and the third reference voltage are accumulated in the capacitors C1 and C2. Generally, when i is an integer of predetermined number, the control circuit controls control switches selected from SW101-SW103, which are arranged between from first order of the capacitor corresponding to the input node to ith order which is a count number of the capacitor from the first order of the capacitor if i is greater than two, on. In addition, the control circuit controls control switches arranged between the ith order of the capacitor and output node of the capacitance circuit off.

After sampling the predetermined voltages, the control circuitry 35 turns on the switching SW101~SW103 to distribute the charges stored in the predetermined number of capacitors to the four capacitors. In charge distribution, each capacitor is distributed with an amount of charge corresponding to its capacitance. When the capacitances of the four capacitors C1 to C 4 are equal, one quarter of the charge stored in the predetermined number of capacitors is distributed to each capacitor. After the distribution of the charge, the control circuit 35 turns off the switching SW103 between the first capacitor and the second capacitor as viewed from the output node side, and outputs the distributed charge from the capacitor C 4 to the integration circuit. In general, if j is greater than one and is the whole number of the plurality of capacitors minus one, the control circuit makes the plurality of the control switch, which are arranged between from jth order which is a count number of the capacitor from the most output node side to j+1th order from the most output node side of the capacitor, off. In this case, the distributed charges are output to the integrating circuit from the j capacitors connected to the output node.

For example, when the capacitances of the capacitors C1 to C 4 are C, if sampling of a predetermined voltage is performed by using one capacitor, charges equivalent to the case where the predetermined voltage is sampled by the capacitor having the capacitance of C/4 can be transferred to the integrating circuit. When the sampling of the predetermined voltage is performed by using two capacitors, the same charge as that when the predetermined voltage is sampled by the capacitor having the capacitance of C/2 can be transferred to the integrating circuit. When the sampling of the predetermined voltage is performed by using three capacitors, charges equivalent to those in the case where the predetermined voltage is sampled by a capacitor having a capacitance of C×¾ can be transferred to the integrating circuit. When the sampling of the predetermined voltage is performed using four capacitors, charges equivalent to those in the case where the predetermined voltage is sampled by the capacitor of the capacitance C can be transferred to the integrating circuit.

In the present embodiment, the control circuit 35 causes the variable capacitance circuit 30a to sample the predetermined voltage during the sampling period in which the analog input signal is sampled. The control circuit 35 causes the variable capacitance circuit 30a to distribute charges after the sampling period and before the integration period in which the integration circuit performs integration. After the charge distribution, the control circuit 35 causes the variable capacitance circuit 30a to output the distributed charge in the integration period.

Operation Procedure

Figure 11:
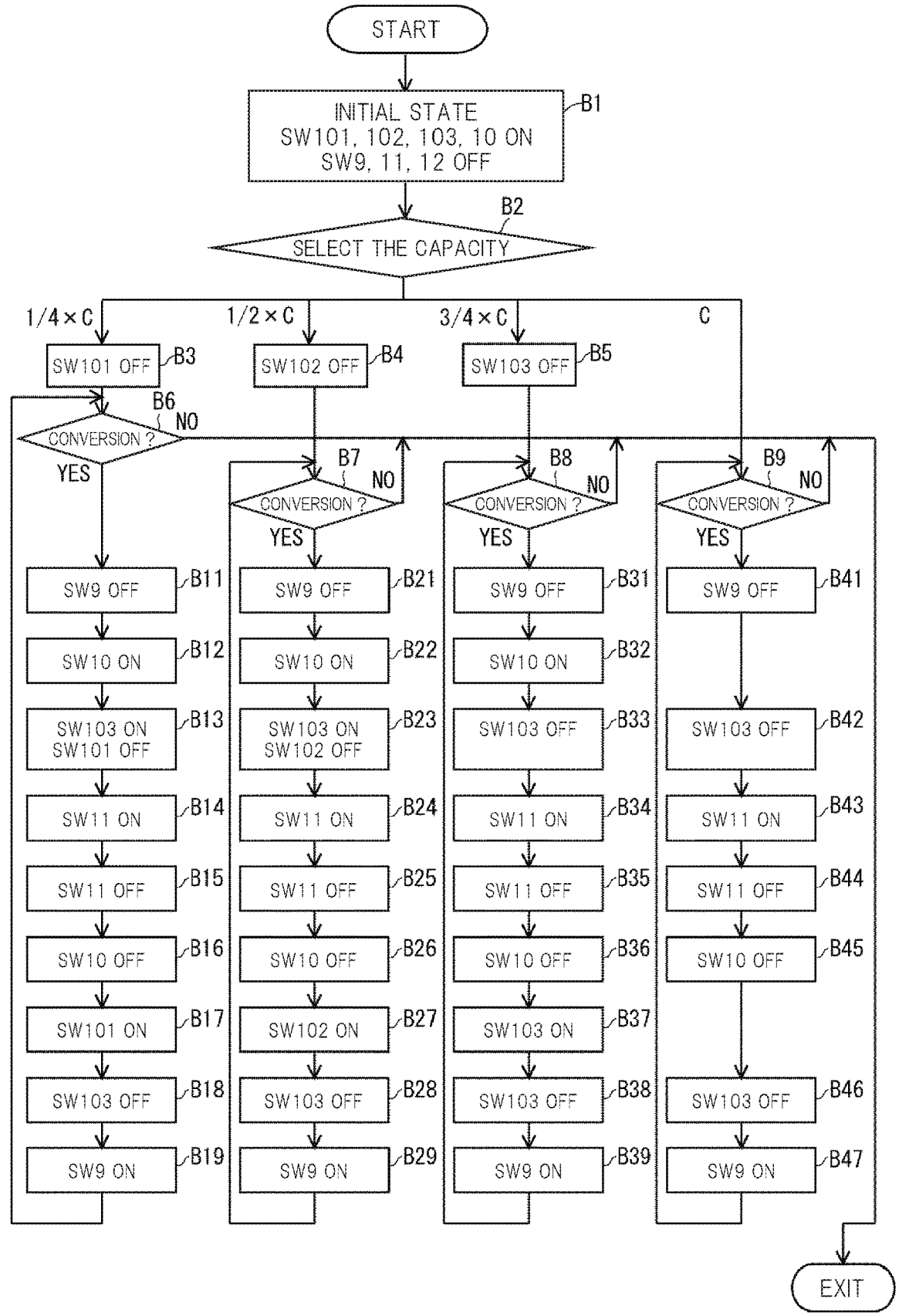
FIG. 11 is a flowchart showing an operation procedure in the second embodiment.

FIG. 11 shows an operation procedure. The controller 35 initially turns on the switches SW101~SW103 and SW10 and turns off the switches SW9, the SW11, and the SW12 (step B1) . The control circuit 35 determines the capacitance of the variable capacitance circuit 30a (step B2). In step B2, the control circuit 35 determines whether the capacitance value of the variable capacitance circuit 30a is C/4, C/2, C×¾, or C by referring to, for example, a register (not shown in FIG. 10).

When it is determined that the capacitance of the variable capacitor circuit 30a is C/4, the control circuit 35 turns off the switching SW101 (step B3). The control circuit 35 determines whether conversion into a digital signal is to be performed (step B6). When it is determined that the conversion is performed in step B6, the control circuit 35 turns off the switch SW9 (step B11) and turns on the switch SW10 (step B12). The controller 35 turns off the switch SW101 and turns on the switch SW103 (step B13). The controller 35 turns on the switch SW11 (step B14). In this manner, charges corresponding to the difference voltage between the reference voltage VA1 and the reference voltage VA3 are accumulated in the capacitor C1. The operation from step B11 to step B14 corresponds to the operation of causing the capacitor C1 to sample a predetermined voltage.

When the sampling of the predetermined voltages is completed, the control circuit 35 turns off the switch SW11 (step B15), turns off the switch SW10 (step B16), and turns on the switch SW101 (step B17). The operation of steps B15 to B17 corresponds to the operation of distributing the charge stored in the capacitor C to the capacitors C1 to C4.

Thereafter, the controller 35 turns off the switch SW103 (step B18) and turns on the switch SW9 (step B19). In this way, the charges distributed to the capacitor C4 are transferred to the integrating circuit through the switched-on SW9. Steps B18 and B19 correspond to the operation of the integration period.

The control circuit 35 returns to step B6 to determine whether or not to continue the conversion. The control circuit 35 repeats steps B11 to B19 until it is determined in step B6 that the conversion is not to be performed. When it is determined that the conversion is not performed in step B6, the control circuit 35 terminates the processing.

When it is determined in step B2 that the capacitance of the variable capacitor circuit 30a is C/2, the control circuit 35 turns off the switch SW102 (step B4). The control circuit 35 determines whether conversion into a digital signal is to be performed (step B7). When it is determined that the conversion is performed in step B7, the control circuit 35 turns off the switch SW9 (step B21) and turns on the switch SW10 (step B22). The controller 35 turns off the switch SW102 and turns on the switch SW103 (step B23). The controller 35 turns on the switch SW11 (step B24). In this manner, charges corresponding to the difference voltage between the reference voltage VA1 and the reference voltage VA3 are accumulated in the two capacitors C1 and C 2. The operation from step B21 to step B24 corresponds to the operation of causing the two capacitors C1 and C 2 to sample a predetermined voltage.

When the sampling of the predetermined voltages is completed, the control circuit 35 turns off the switch SW11 (step B25), turns off the switch SW10 (step B26), and turns on the switch SW102 (step B27). The operation of steps B25 to B27 corresponds to the operation of distributing the charges stored in the capacitors C1 and C 2 to the capacitors C1 to C4.

Thereafter, the controller 35 turns off the switch SW103 (step B28) and turns on the switch SW9 (step B29). In this way, the charges distributed to the capacitor C4 are transferred to the integrating circuit through the switched-on SW9. Steps B28 and B29 correspond to the operation of the integration period.

The control circuit 35 returns to step B7 to determine whether or not to continue the conversion. The control circuit 35 repeats steps B21 to B29 until it is determined in step B7 that the conversion is not to be performed. When it is determined that the conversion is not performed in step B7, the control circuit 35 terminates the processing.

When it is determined in step B2 that the capacitance of the variable capacitor circuit 30a is C×¾, the control circuit 35 turns off the switch SW103 (step B5). The control circuit 35 determines whether conversion into a digital signal is to be performed (step B8). When it is determined that the conversion is performed in step B8, the control circuit 35 turns off the switch SW9 (step B31) and turns on the switch SW10 (step B32). The controller 35 turns off the switching SW103 (step B33). The controller 35 turns on the switch SW11 (step B34). In this manner, charges corresponding to the difference voltage between the reference voltage VA1 and the reference voltage VA3 are accumulated in the three capacitors C1 to C3. The operation from step B31 to step B34 corresponds to the operation of causing the three capacitors C1 to C3 to sample a predetermined voltage.

When the sampling of the predetermined voltages is completed, the control circuit 35 turns off the switch SW11

(step B35), turns off the switch SW10 (step B36), and turns on the switch SW103 (step B37). The operation of steps B35 to B37 corresponds to the operation of distributing the charges stored in the capacitors C1 to C3 to the capacitors C1 to C4.

Thereafter, the controller 35 turns off the switch SW103 (step B38) and turns on the switch SW9 (step B39). In this way, the charges distributed to the capacitor C4 are transferred to the integrating circuit through the switched-on SW9. Steps B38 and B39 correspond to the operation of the integration period.

The control circuit 35 returns to step B8 to determine whether or not to continue the conversion. The control circuit 35 repeats steps B31 to B39 until it is determined in step B8 that the conversion is not to be performed. When it is determined that the conversion is not performed in step B8, the control circuit 35 terminates the processing.

When it is determined in step B2 that the capacitance of the variable capacitance circuit 30a is set to C, the control circuit 35 determines whether or not conversion to a digital signal is to be performed (step B9). When the control circuit 35 determines to perform the transformation in step B9, the control circuit 35 turns off the switch SW9 (step B41) and turns on the switch SW103 (step B42). The controller 35 turns on the switch SW11 (step B43). In this manner, charges corresponding to the difference voltage between the reference voltage VA1 and the reference voltage VA3 are accumulated in the four capacitors C1 to C4. The operation from step B41 to step B43 corresponds to the operation of causing the four capacitors C1 to C3 to sample a predetermined voltage.

When the sampling of the predetermined voltages is completed, the control circuit 35 turns off the switch SW11 (step B44) and turns off the switch SW10 (step B45). When the predetermined voltage is sampled in the four capacitors C1 to C4, the charge is not distributed. The controller 35 turns off the switch SW103 (step B46) and turns on the switch SW9 (step B47). In this manner, charges accumulated in the capacitor C4 are transferred to the integrating circuit through the switched-on SW9. Steps B46 and B47 correspond to the operation of the integration period.

The control circuit 35 returns to step B9 to determine whether or not to continue the conversion. The control circuit 35 repeats steps B41 to B47 until it is determined in step B9 that the conversion is not to be performed. When it is determined that the conversion is not performed in step B9, the control circuit 35 terminates the processing. In the above description, the predetermined voltages are sampled using several capacitors, and after the distribution of the charges, the switching SW103 is turned off in steps B18, B28, B38, or B46, and the distributed charges are outputted from the capacitor C4. Conversely, the capacitor C1 may be used to sample a predetermined voltage, and after the distribution of the charge, the charge may be output from several capacitors. For example, the predetermined voltages may be sampled using the capacitor C1, the charges stored in the capacitor C1 may be distributed to the four capacitors C1 to C4, and then the switching SW102 may be turned off, and the charges may be outputted from the capacitors C3 and C4. The capacitance value of the variable capacitance circuit 30a can be C/4, C/2, C×¾, or C by changing the number of capacitors used for the output of charges. In general, when the number of capacitors used for sampling a predetermined voltage is i, the number of capacitors to which charges are distributed is N, the number of capacitors used for output of charges is j, and the capacitance of each capacitor is C, the capacitance value of the variable capacitance circuit 30a can be represented by $(C\times i)\times(1/N)\times j$.

Operation Example 1

Figure 12:
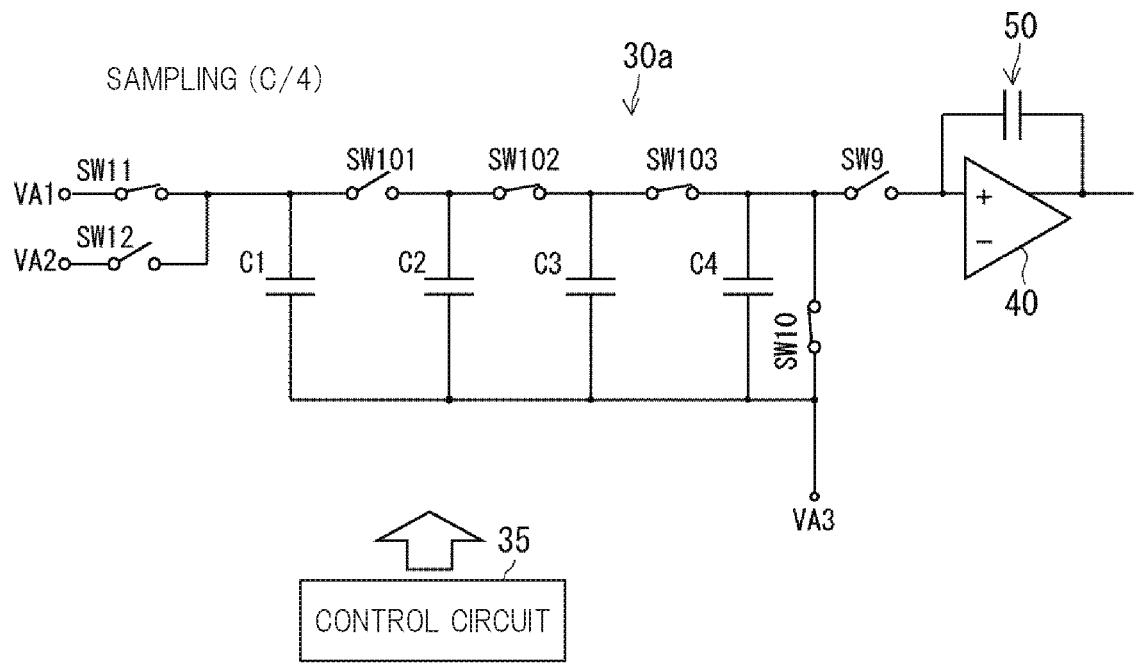
FIG. 12 is a block diagram showing a dithering circuit at the time of sampling.

FIG. 12 shows a dithering circuit at the time of sampling when the capacitance of the variable capacitance circuit 30a is C/4. When sampling predetermined voltages, the control circuit 35 turns on the switches SW10 and SW11 and turns off the switches SW12 and SW9. When the capacitance is C/4, the control circuit 35 turns off the switch SW101 and turns on the switches SW102 and SW103. In this instance, the reference voltage VA1 input via the switching SW11 is input only to the capacitor C1, and the capacitor C1 accumulates charges corresponding to the difference between the reference voltage VA1 and the reference voltage VA3. Specifically, the quantity of charges Qs accumulated in the capacitor C1 at the time of sampling a predetermined voltage becomes $Qs=C(VA1-VA3)$.

Figure 13:
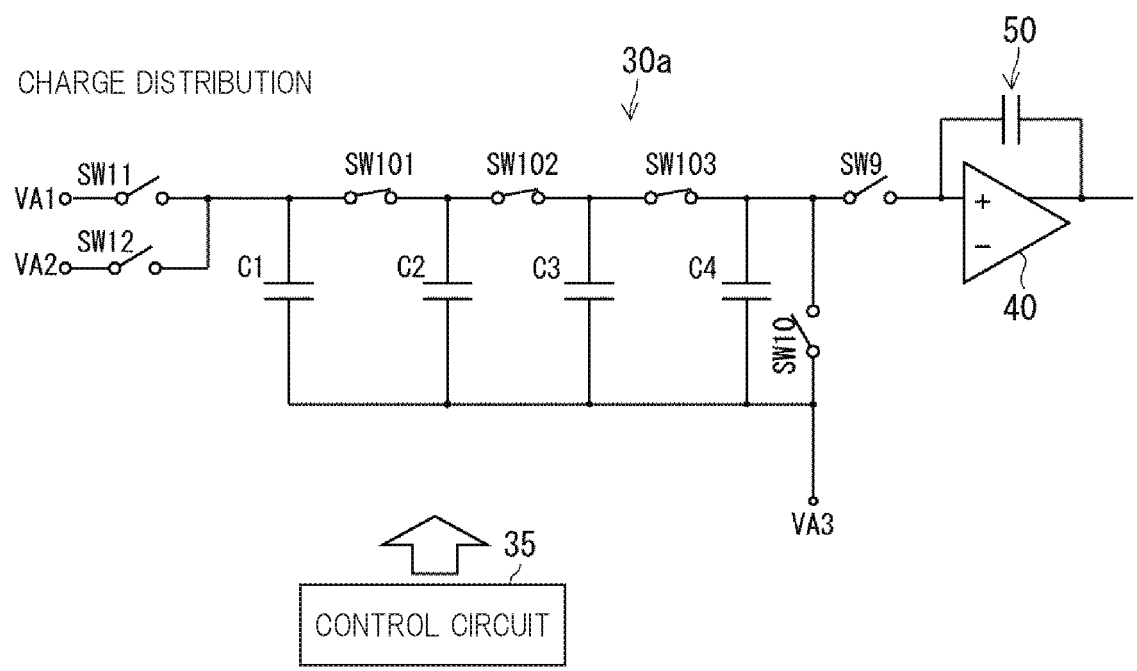
FIG. 13 is a block diagram showing a dithering circuit at the time of charge distribution.

FIG. 13 shows a dithering circuit at the time of charge distribution. The control circuit 35 turns off the switches SW9, the SW10, the SW11, and the SW12 and turns on the switch SW101~SW103 at the time of charge distribution. Since the capacitors C1 to C4 are connected in parallel, the charge stored in the capacitor C1 is distributed to the four capacitors so that the voltages across the capacitors become equal. The sum of the charge amounts accumulated in the four capacitors after the charge distribution is equal to the charge amount Qs accumulated in the capacitor C1 at the time of sampling of the predetermined voltage. Specifically, the charge quantity Qd to be distributed to the respective capacitors after the charge distribution is $Qd=(¼)Qs=(¼)\times C(VA1-VA3)$. Note that the distribution of the charge is not limited to one, and the distribution of the charge may be performed a plurality of times. For example, in the variable capacitance circuit 30a, after the distribution of the charges to the four capacitors C1 to C4, the charges of the capacitors C 2 to C4 may be reset, and the charges of the capacitor C1 may be distributed to the four capacitors C1 to C4 again.

Figure 14:
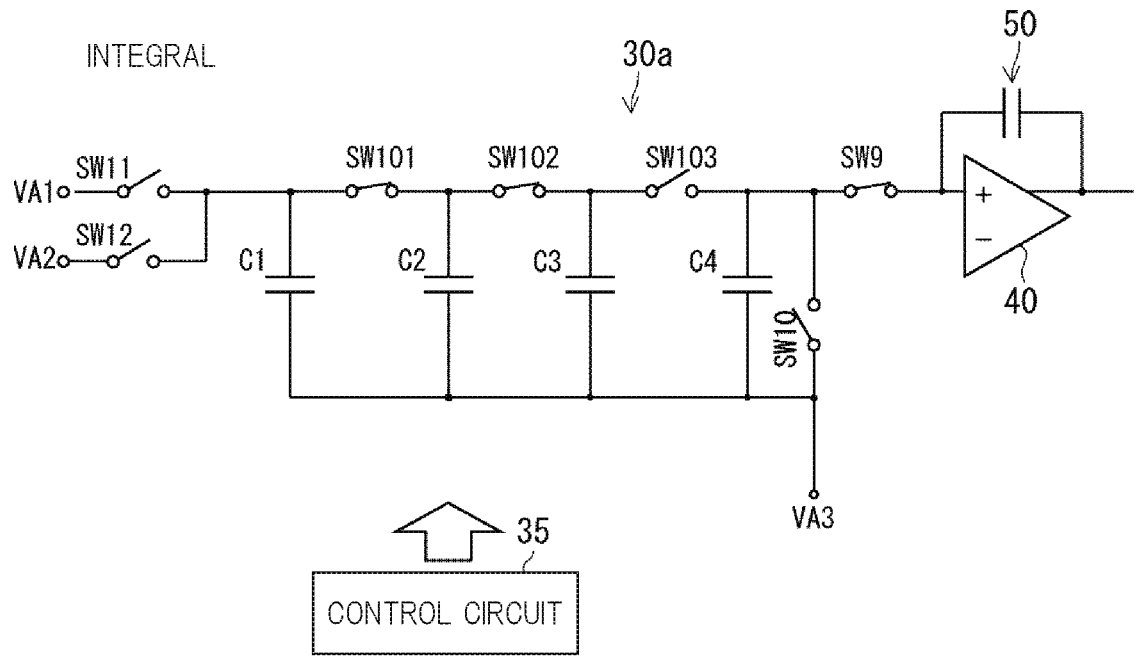
FIG. 14 is a block diagram showing the dithering circuit in the integration period.

FIG. 14 shows the dithering circuit in the integration period. The control circuitry 35 turns on the switch SW9 and turns off the switch SW10, SW11, and SW12 during the integration period. The controller 35 turns on the switches SW101 and SW102 and turns off the switch SW103. When the switching SW103 is turned off, only the capacitor C4 is connected to the output node, and the charges distributed to the capacitor C4 are transferred to the integration circuit. The quantity of charges transferred to the integrating circuit at the time of integration is $Qi=Qd=(¼)\times C(VA1-VA3)$. This is equivalent to sampling the difference voltage between the reference voltage VA1 and the reference voltage VA3 by using a capacitor having a capacitance of ¼ times in the variable capacitance circuit 30a.

Operation Example 2

Figure 15:
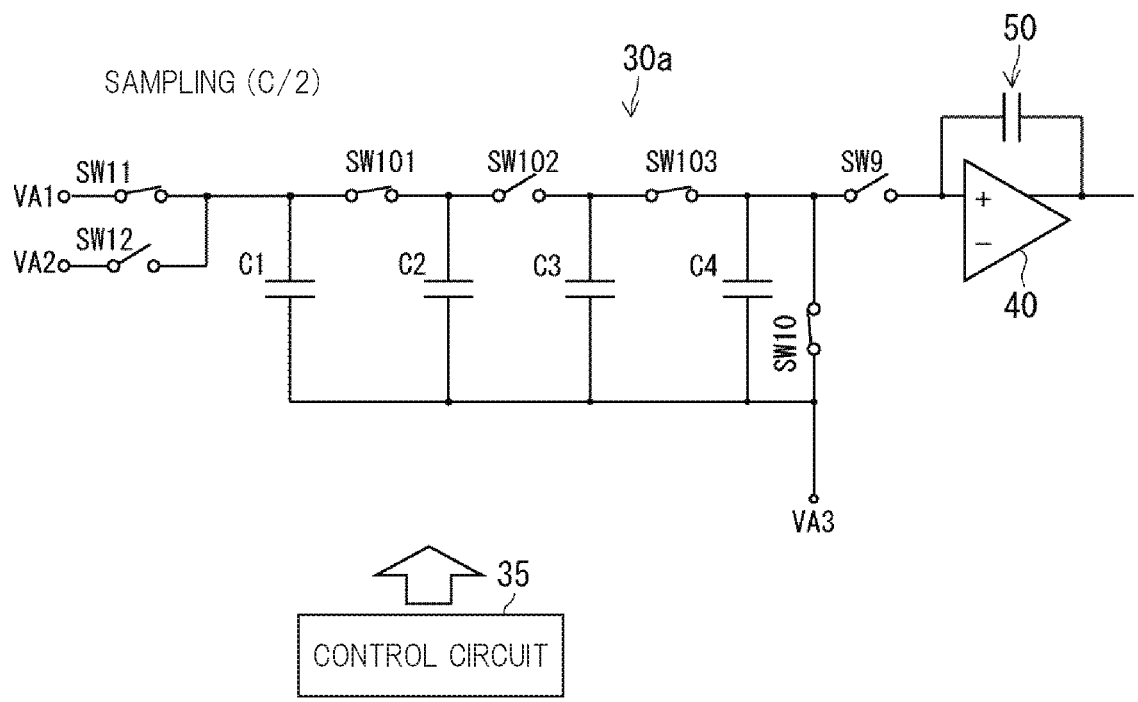
FIG. 15 is a block diagram showing a dithering circuit at the time of sampling.

FIG. 15 shows a dithering circuit at the time of sampling when the capacitance of the variable capacitance circuit 30a is C/2. When sampling predetermined voltages, the control circuit 35 turns on the switches SW10 and SW11 and turns off the switches SW12 and SW9. When the capacitance is C/2, the control circuit 35 turns off the switch SW102 and turns on the switches SW101 and SW103. In this instance, the reference voltage VA1 input via the switching SW11 is input to the capacitors C1 and C 2, and the capacitors C1 and C 2 accumulate charges corresponding to differences between the reference voltage VA1 and the reference voltage VA3, respectively. The charge amount Qs accumulated in each of the capacitors C1 and C 2 at the time of sampling the predetermined voltages is $Qs=C(VA1-VA3)$, and the sum of the charge amounts is $2Qs=2C(VA1-VA3)$.

At the time of charge distribution, as shown in FIG. 13, the control circuit 35 turns off the switches SW9, the SW10, the SW11, and the SW12, and turns on the switch SW101~SW103. In this case, the total 2Qs of charge stored in the two capacitors C1 and C 2 is distributed to the four capacitors. Specifically, the charge quantity Qd to be distributed to the respective capacitors after the charge distribution is $Qd=(1/4)2Qs=(1/2)\times C(VA1-VA3)$.

The control circuit 35 turns on the switch SW9 and turns off the switch SW10, SW11, and SW12 during the integration period, as shown in FIG. 14. The controller 35 turns on the switches SW101 and SW102 and turns off the switch SW103. In this instance, the quantity of charges Qi transferred from the capacitor C4 to the integrating circuit becomes $Qi=Qd=(1/2)\times C(VA1-VA3)$. This is equivalent to sampling the difference voltage between the reference voltage VA1 and the reference voltage VA3 by using a capacitor having a capacitance of ½ times in the variable capacitance circuit 30a.

Example Operation Waveform

Figure 16:
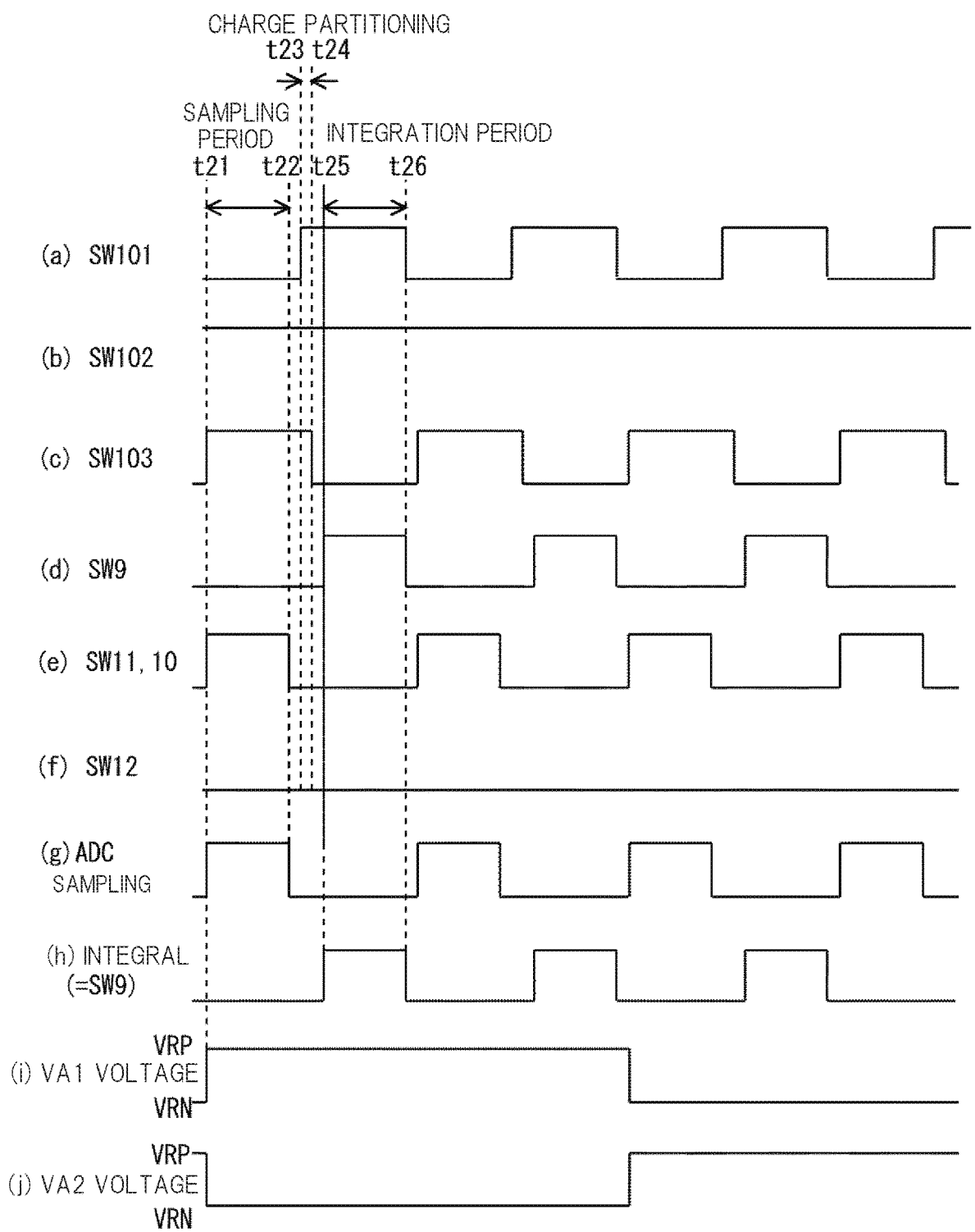
FIG. 16 is a timing chart showing an example of operation waveforms of the respective units.

FIG. 16 shows an example of operation waveforms of the respective units. Here, it is assumed that the capacitance of the variable capacitance circuit 30a is controlled to C/4. At time t21, the controller 35 turns off the switch SW101 (see (a)) and turns on the switches SW102 and SW103 (see (b) and (c)). The control circuitry 35 also turns off the switches SW11 and SW10 from off to on (see (e)) and leaves the switches SW9 and SW12 off (see (d) and (f)). At this time, the sampling capacitor 20 (see FIG. 1) samples the analog input signal (see (g)).

When the sampling period ends at time t22, the control circuit 35 turns off the switches SW11 and the switch SW10 (see (e)). At this time, sampling of the analog input signal in the sampling capacitor 20 is also finished (see (g)). In the example of FIG. 16, the sampling of the analog input signal (the sampling period of the ADC) of (g) ends at time t22, but the present invention is not limited thereto. The sampling period of the ADC may end at any time between time t22 and time t25, for example, may end at time t24. From time t21 to time t22, it is assumed that the reference voltage VA1 is the reference voltage VRP and the reference voltage VA2 is the reference voltage VRN (see (i) and (j)). In the sampling period, charges corresponding to the difference voltage between the reference voltage VRP and the reference voltage VA3 are accumulated in the capacitor C1 (see FIG. 12). Instead of turning on the switch SW11 in the sampling period, the switch SW12 may be turned on in the sampling period.

After the sampling period ends, the control circuit 35 turns the switching SW101 from off to on at time t23 (see (a)). At this time, all the switches SW9~SW12 are off (see (d) to (f)). In the variable capacitance circuit 30a, charges accumulated in the capacitor C1 in the sampling period are distributed to the four capacitors C1 to C4 (see FIG. 13). At time t24, the controller 35 turns the switching SW103 from on to off (see (c)). When the switching SW103 is turned off, the capacitor C4 and the capacitors C1 to C3 are separated from each other.

After the distribution of charges, the control circuit 35 turns on the switch SW9 from off at time t25 (see (d)), and causes the integration circuit composed of the amplifier 40 and the integration capacitor 50 to perform integration (see (h)). The integrated circuit is charged from the sampling capacity and capacitor C4 (see also FIG. 14). When the integration period ends at time t26, the control circuit 35 turns switch SW9 from off to on (see (d)). The integrating circuit stops the integrating operation when the switching SW9 is turned off (see (h)).

Thereafter, similarly, the operation in the sampling period from time t21 to t22, the operation in the charge distribution from time t23 to t24, and the operation in the integration period from time t25 to 216 are alternately performed. The reference voltages VA1 and VA2 are switched between the reference voltage VRP and the reference voltage VRN at a frequency twice the sampling frequency, for example, as in the first embodiment.

Summary

In the present embodiment, the variable capacitance circuit 30a includes a plurality of capacitors that are connected in parallel each other. In the present embodiment, the control circuit makes the capacitance circuit outputs the additional voltage, by making predetermined numbers of capacitors, which is in the plurality of the capacitors, sample predetermined voltage, distributes charge which is stored by the predetermined number of capacitors to the whole of the plurality of capacitor, and makes some of the pluralities of capacitors output charge which is distributed according to the control circuit. By doing so, similarly to the first embodiment, it is possible to realize a minute capacitance while using a capacitor having a capacitance larger than that of the minute capacitance to be realized.

In the present embodiment, when the capacitance of the capacitors C1 to C4 is C, the capacitance of the variable capacitance circuit 30a can be controlled to C/4, C/2, C×¾, or C. In the present embodiment, the capacitance of the variable capacitance circuit 30a can be linearly controlled.

Modification 1

In the first embodiment, an example in which the variable capacitance circuit 30 is used as a dither capacitance has been described. In addition to the use of the variable capacitance circuit 30 for the dither capacitance, a variable capacitance circuit having a circuit configuration similar to that of the variable capacitance circuit 30 may be used for the sampling capacitance 20. In this instance, the sampling capacitor may be configured such that, in the configuration of the variable capacitance circuit 30 shown in FIG. 2, the switches SW11 and SW12 are replaced with the switches SWVRP and SWVRN shown in FIG. 1, and a switch SWAIN is added to the input node.

As described above, the capacitance value of the sampling capacitance tends to be small due to the system speed increase and the like. The sampling capacity, including the dither capacity, also needs to have a ratio to the integration capacity 50, and accuracy is required. If the sampling capacity becomes low, local variation becomes large, and there is a case where the sampling capacity of the low capacity value cannot be realized with high accuracy. In such a case, by using a circuit similar to the variable capacitance circuit 30 described in the first embodiment not only for the dither capacitance but also for the portion of the sampling capacitance, the sampling capacitance of the low capacitance value can be realized with high accuracy. When the sampling capacitance is reduced, even when the driving capability of an amplifier or the like in the preceding stage of the analog-to-digital converter 10 for outputting the analog input signal is low, the charge corresponding to the analog input signal can be sampled in the sampling capacitance.

Instead of the above, a variable capacitance circuit having a circuit configuration similar to that of the variable capacitance circuit 30a described in Second Embodiment may be used as the sampling capacitor 20. Even in this case, the sampling capacity of the low capacity value can be realized with high accuracy. In addition, there is also an effect that thermal noise can be reduced.

Modification 2

In Modified Example 1, an example in which a circuit similar to the variable capacitance circuit 30 or the variable capacitance circuit 30a is used as the sampling capacitance of the analog-to-digital converter 10 configured as a ΔΣ ADC has been described, but the present invention is not limited thereto. A sampling circuit that samples a signal and outputs the signal to a converter or a detector at a subsequent stage may employ a circuit similar to the variable capacitance circuit 30 or the variable capacitance circuit 30a. For example, in a sampling circuit configured as a normal switched capacitor, by replacing the sampling capacitance with a capacitance circuit having a configuration similar to that of the variable capacitance circuit 30 or the variable capacitance circuit 30a, a sampling capacitance of a low capacitance value can be realized with high accuracy.

Although the present disclosure has been specifically described based on the embodiments described above, the present disclosure is not limited to the embodiments already described, and it is needless to say that various modifications can be made without departing from the gist thereof.

For example, some or all of the above embodiments may also be described as the following additional statements, but are not limited to the following.

Additional Statement 1.

An analog digital converter comprising:

a quantizer quantizing input signal and outputting the quantized signal, a sampling circuit sampling analog input signal and output differential signal according to difference between the sampled analog input signal and a feedback signal corresponding to the quantized signal, a dithering circuit generating additional voltage, an integrating circuit integrating signal which the differential signal and the additional voltage is added, and outputting signal to the quantizer, wherein the dithering circuit comprises;

a capacitance circuit comprising plurality of capacitors, a control circuit for making the capacitance circuit output the additional voltage, while controlling the capacitance of the capacitance circuit to keep it smaller than the biggest capacitance of the plurality of the capacitors.

Additional Statement 2.

An analog digital converter according Additional statement 1, wherein each capacitor of the plurality of capacitors is connected to each other in series between an input node and output node of the capacitance circuit, and wherein the control circuit for making the capacitance circuit output the additional voltage with a predetermined number of the capacitors from the plurality of capacitors.

Additional Statement 3.

An analog digital converter according to Additional statement 2, wherein the sampling circuit outputs the differential signal according to difference between the analog signal and the feedback signal, within an integration period which the integrating circuit integrates the differential signal, wherein the control circuit makes the predetermined numbers of capacitors sample predetermined voltage within a sampling period when the sampling circuit samples the analog input signal, and making the predetermined numbers of capacitors output the additional voltage corresponding to the predetermined voltage within the integration period.

Additional Statement 4.

An analog digital converter according to Additional statement 3, wherein the control circuit makes the predetermined numbers of capacitors sample voltage of difference between third reference voltage of the output node and one of first reference voltage and second reference voltage that are inputted to the input node within the sampling period, and making the predetermined numbers of capacitors output the additional voltage corresponding to the other of first reference voltage and the second reference voltage that are inputted to the input node within the integration period.

Additional Statement 5.

An analog digital converter according to Additional statement 4, the capacitance circuit further comprising plurality of capacitors changing switch arranged between the input node and input node side terminals of the plurality of capacitors respectively, when n is an integer of describing number of the capacitors which are used for generating the additional voltage, wherein the control circuit makes the capacitor changing switches arranged between the input node and input node side terminal of the capacitor that is n order which is count number of the capacitor from the most input node side on, and making other remaining capacitors changing switches off, within both the sampling period and integration period.

Additional Statement 6.

An analog digital converter according to Additional statement 4, the dithering circuit further comprising, first voltage changing switch arranged between a terminal of the first reference voltage and the input node of the capacitance circuit, and second voltage changing switch arranged between a terminal of the second reference voltage and the input node of the capacitance circuit, wherein the control circuit makes one of the first voltage changing switch and second voltage changing switch on and other of the first voltage changing switch and second voltage changing switch off within sampling period, and making the other of the first voltage changing switch and second voltage changing switch on and the one of the first voltage changing switch and second voltage changing switch off within integration period.

Additional Statement 7.

An analog digital converter according to Additional statement 4, wherein the first reference voltage and the second reference voltage are changed predetermined fourth voltage and predetermined fifth voltage alternatively, the second reference voltage is the fifth voltage when the first reference voltage is the fourth voltage, and the second reference voltage is the fifth voltage when the first reference voltage is the fourth voltage.

Additional Statement 8.

An analog digital converter according to Additional statement 4, the capacitance circuit further comprising plurality of initialization switch which are arranged between a terminal of predetermined initialization voltage and input node side terminals of the plurality of capacitors respectively, the control circuit turns on the plurality of initialization switch at timing of operation of the capacitance circuit start.

Additional Statement 9.

An analog digital converter according to Additional statement 8,
wherein the initialization voltage being the third reference voltage, and
the control circuit turns on the plurality of initialization switch while the output node of the capacitance circuit being connected to the third reference voltage.

Additional Statement 10.

An analog digital converter according to Additional statement 1,
wherein each capacitance of the plurality of capacitors being equal to each other.

Additional Statement 11.

An analog digital converter according to Additional statement 1,
wherein the plurality of capacitors being connected in parallel each other,
wherein the control circuit makes the capacitance circuit outputs the additional voltage, by making predetermined numbers of capacitors, which is in the plurality of the capacitors, sample predetermined voltage, distributing charge which is stored by the predetermined number of capacitors to the whole of the plurality of capacitor, and making one of the pluralities of capacitors output charge which is distributed according the control circuit.

Additional Statement 12.

An analog digital converter according to Additional statement 11,
wherein the sampling circuit outputting the differential signal which is difference between the analog input signal and the feedback signal, within a period when the integrating circuit is integrating the differential signal,
wherein the control circuit makes the capacitance circuit sample the predetermined voltage in a sampling period when the sampling circuit samples the analog input circuit, making the capacitance circuit distribute charge which is integrated from the sampling period to the integration period, and making the capacitance circuit output charge which is distributed within the integration period.

Additional Statement 13.

An analog digital converter according to Additional statement 11,
wherein the control circuit makes the predetermined number of capacitors sample differential voltage which is the difference between the third reference voltage and one of the second reference voltage and the first reference voltage which is inputted from the input node of the capacitance circuit.

Additional Statement 14.

An analog digital converter according to Additional statement 11,
the capacitance circuit further comprising a plurality of parallel number control switches, one side terminals of the plurality of capacitors being connected to an node of third reference voltage, one of the plurality of parallel number control switches being connected between the other side terminal of one capacitor of the plurality of capacitors and the other side of terminal of another capacitor, which is next to the one capacitor, of the plurality of capacitors, respectively,
wherein i is an integer of predetermined number,
wherein at the sampling of the predetermined voltage, the control circuit controlling the parallel number control switches, which are arranged between from first order of the capacitor corresponding to the input node to ith order which is a count number of the capacitor from the first order of the capacitor if i is greater than one, on, and controlling the parallel number control switches arranged between the ith order of the capacitor and output node of the capacitance circuit off.

Additional Statement 15.

An analog digital converter according to Additional statement 14,
wherein the control circuit makes each of the plurality of the parallel number control switch on, at a period of distribution of the charge which is stored.

Additional Statement 16.

An analog digital converter according to Additional statement 14,
wherein the control circuit makes the plurality of the parallel number control switch, which are arranged between from jth order which is a count number of the capacitor from the most output node side to j+1th order from the most output node side of the capacitor if j is greater than one and is the whole number of the plurality of capacitors minus one, off.

Additional Statement 17.

An analog digital converter according to Additional statement 13,
the dithering circuit further comprising,
first voltage changing switch arranged between a terminal of the first reference voltage and the input node of the capacitance circuit, and
second voltage changing switch arranged between a terminal of the second reference voltage and the input node of the capacitance circuit,
wherein the control circuit makes one of the first voltage changing switch and second voltage changing switch on and other of the first voltage changing switch and second voltage changing switch off within sampling period.

Additional Statement 18.

An analog digital converter according to Additional statement 17,
wherein the first reference voltage and the second reference voltage are changed predetermined fourth voltage and predetermined fifth voltage alternatively, the second reference voltage is the fifth voltage when the first reference voltage is the fourth voltage, and the second reference voltage is the fifth voltage when the first reference voltage is the fourth voltage.

Additional Statement 19.

A semiconductor device including an analog digital converter,
the analog digital converter comprising:
a quantizer quantizing input signal and outputting the quantized signal,
a sampling circuit sampling analog input signal and output differential signal according to difference between the sampled analog input signal and a feedback signal corresponding to the quantized signal,
a dithering circuit generating additional voltage, and
wherein the dithering circuit comprises;
a capacitance circuit comprising plurality of capacitors, and
a control circuit for making the capacitance circuit output the additional voltage, while controlling the capacitance of the capacitance circuit to keep it smaller than the biggest capacitance of the plurality of capacitors, and
an integrating circuit integrating signal which the differential signal and the additional voltage is added, and outputting signal to the quantizer.

Additional Statement 20.

A semiconductor device according to Additional statement 19,
each of the plurality of capacitors comprising:
a first electrode,
a second electrode which facing to the first electrode, and
a dielectric layer disposed in between the first electrode and the second electrode.

Additional Statement 21.

A semiconductor device according to Additional statement 19,
each of the plurality of capacitors comprising:
a first conductive line and a second conductive line, wherein the first conductive line and the second conductive line arranged in parallel in same interconnection layer.

Additional Statement 22.

A sampling circuit comprising:
a capacitance circuit comprising plurality of capacitors,
a control circuit for controlling the capacitance of the capacitance circuit to keep it smaller than the biggest capacitance of the plurality of capacitors.

Additional Statement 23.

A sampling circuit according Additional statement 22,
wherein each capacitor of the plurality of capacitors is connected to each other in series between an input node and output node of the capacitance circuit,
and wherein the control circuit for making the capacitance circuit do sampling to input signal with a predetermined number of the capacitors from the plurality of capacitors.

Additional Statement 24.

A sampling circuit according to Additional statement 22,
wherein the plurality of capacitors being connected in parallel each other,
wherein the control circuit makes predetermined numbers of capacitors, which is in the plurality of the capacitors, sample input signal, distributes charge which is stored by the predetermined number of capacitors to the whole of the plurality of capacitor, and makes one of the pluralities of capacitors output charge which is distributed according the control circuit.

Additional Statement 25.

A sampling circuit according to Additional statement 22,
wherein the sampling circuit is configured to a switched capacitor circuit.

Additional Statement 26.

A sampling circuit according to Additional statement 22,
wherein the sampling circuit is configured to output signal, which is sampled by the sampling circuit, to an analog digital converter.

Additional Statement 27.

A method for generating voltage signal including steps of:
providing a capacitance circuit comprising a plurality of capacitors each of which is connecting between an input node and output node,
storing charge to a smaller number of the capacitors than the whole number of the capacitors,
outputting the storing charge from the capacitance circuit.

Additional Statement 28.

A method for generating voltage signal including steps of:
providing a capacitance circuit comprising plurality of capacitors being connected in parallel each other,
making predetermined numbers of capacitors, which is in the plurality of the capacitors, store a charge corresponding to input signal,
distributing charge which is stored by the predetermined number of capacitors to the whole of the plurality of capacitor,
and making one of the pluralities of capacitors output the charge which is distributed.

What is claimed is:

1. An analog digital converter comprising:
a quantizer quantizing input signal and outputting the quantized signal,
a sampling circuit sampling analog input signal and output differential signal according to difference between the sampled analog input signal and a feedback signal corresponding to the quantized signal,
a dithering circuit generating additional voltage,
an integrating circuit integrating signal which the differential signal and the additional voltage is added, and outputting signal to the quantizer,
wherein the dithering circuit comprises;
a capacitance circuit comprising plurality of capacitors,
a control circuit for making the capacitance circuit output the additional voltage, while controlling the capacitance of the capacitance circuit to keep it smaller than the biggest capacitance of the plurality of the capacitors.

2. An analog digital converter according claim 1,
wherein each capacitor of the plurality of capacitors is connected to each other in series between an input node and output node of the capacitance circuit,
and wherein the control circuit for making the capacitance circuit output the additional voltage with a predetermined number of the capacitors from the plurality of capacitors.

3. An analog digital converter according to claim 2,
wherein the sampling circuit outputs the differential signal according to difference between the analog signal and the feedback signal, within an integration period which the integrating circuit integrates the differential signal,
wherein the control circuit makes the predetermined numbers of capacitors sample predetermined voltage within a sampling period when the sampling circuit samples the analog input signal, and making the predetermined numbers of capacitors output the additional voltage corresponding to the predetermined voltage within the integration period.

4. An analog digital converter according to claim 3,
wherein the control circuit makes the predetermined numbers of capacitors sample voltage of difference between third reference voltage of the output node and one of first reference voltage and second reference voltage that are inputted to the input node within the sampling period, and making the predetermined numbers of capacitors output the additional voltage corresponding to the other of first reference voltage and the second reference voltage that are inputted to the input node within the integration period.

5. An analog digital converter according to claim 4,
the capacitance circuit further comprising plurality of capacitors changing switch arranged between the input node and input node side terminals of the plurality of capacitors respectively,
when n is an integer of describing number of the capacitors which are used for generating the additional voltage,
wherein the control circuit makes the capacitor changing switches arranged between the input node and input node side terminal of the capacitor that is n order which is count number of the capacitor from the most input node side on, and making other remaining capacitors changing switches off, within both the sampling period and integration period.

6. An analog digital converter according to claim 4,
the dithering circuit further comprising,
first voltage changing switch arranged between a terminal of the first reference voltage and the input node of the capacitance circuit, and
second voltage changing switch arranged between a terminal of the second reference voltage and the input node of the capacitance circuit,
wherein the control circuit makes one of the first voltage changing switch and second voltage changing switch on and other of the first voltage changing switch and second voltage changing switch off within sampling period, and making the other of the first voltage changing switch and second voltage changing switch on and the one of the first voltage changing switch and second voltage changing switch off within integration period.

7. An analog digital converter according to claim 4,
wherein the first reference voltage and the second reference voltage are changed predetermined fourth voltage and predetermined fifth voltage alternatively, the second reference voltage is the fifth voltage when the first reference voltage is the fourth voltage, and the second reference voltage is the fifth voltage when the first reference voltage is the fourth voltage.

8. An analog digital converter according to claim 4,
the capacitance circuit further comprising plurality of initialization switch which are arranged between a terminal of predetermined initialization voltage and input node side terminals of the plurality of capacitors respectively,
the control circuit turns on the plurality of initialization switch at timing of operation of the capacitance circuit start.

9. An analog digital converter according to claim 8,
wherein the initialization voltage being the third reference voltage, and
the control circuit turns on the plurality of initialization switch while the output node of the capacitance circuit being connected to the third reference voltage.

10. An analog digital converter according to claim 1,
wherein each capacitance of the plurality of capacitors being equal to each other.

11. An analog digital converter according to claim 1,
wherein the plurality of capacitors being connected in parallel each other,
wherein the control circuit makes the capacitance circuit outputs the additional voltage, by making predetermined numbers of capacitors, which is in the plurality of the capacitors, sample predetermined voltage, distributing charge which is stored by the predetermined number of capacitors to the whole of the plurality of capacitor, and making one of the pluralities of capacitors output charge which is distributed according to the control circuit.

12. An analog digital converter according to claim 11,
wherein the sampling circuit outputting the differential signal which is difference between the analog input signal and the feedback signal, within a period when the integrating circuit is integrating the differential signal,
wherein the control circuit makes the capacitance circuit sample the predetermined voltage in a sampling period when the sampling circuit samples the analog input circuit, making the capacitance circuit distribute charge which is integrated from the sampling period to the integration period, and making the capacitance circuit output charge which is distributed within the integration period.

13. An analog digital converter according to claim 11,
wherein the control circuit makes the predetermined number of capacitors sample differential voltage which is the difference between the third reference voltage and one of the second reference voltage and the first reference voltage which is inputted from the input node of the capacitance circuit.

14. An analog digital converter according to claim 11,
the capacitance circuit further comprising a plurality of parallel number control switches, one side terminals of the plurality of capacitors being connected to an node of third reference voltage, one of the plurality of parallel number control switches being connected between the other side terminal of one capacitor of the plurality of capacitors and the other side of terminal of another capacitor, which is next to the one capacitor, of the plurality of capacitors, respectively,
wherein i is an integer of predetermined number,
wherein at the sampling of the predetermined voltage, the control circuit controlling the parallel number control switches, which are arranged between from first order of the capacitor corresponding to the input node to ith order which is a count number of the capacitor from the first order of the capacitor if i is greater than one, on, and controlling the parallel number control switches arranged between the ith order of the capacitor and output node of the capacitance circuit off.

15. An analog digital converter according to claim 14,
wherein the control circuit makes each of the plurality of the parallel number control switch on, at a period of distribution of the charge which is stored.

16. An analog digital converter according to claim 14,
wherein the control circuit makes the plurality of the parallel number control switch, which are arranged between from jth order which is a count number of the capacitor from the most output node side to j+1th order from the most output node side of the capacitor if j is greater than one and is the whole number of the plurality of capacitors minus one, off.

17. A semiconductor device including an analog digital converter,
the analog digital converter comprising:
a quantizer quantizing input signal and outputting the quantized signal,
a sampling circuit sampling analog input signal and output differential signal according to difference between the sampled analog input signal and a feedback signal corresponding to the quantized signal,
a dithering circuit generating additional voltage, and
wherein the dithering circuit comprises;
a capacitance circuit comprising plurality of capacitors, and
a control circuit for making the capacitance circuit output the additional voltage, while controlling the capacitance of the capacitance circuit to keep it smaller than the biggest capacitance of the plurality of capacitors, and
an integrating circuit integrating signal which the differential signal and the additional voltage is added, and outputting signal to the quantizer.

18. A semiconductor device according to claim 17,
each of the plurality of capacitors comprising:
a first electrode,
a second electrode which facing to the first electrode, and a dielectric layer disposed in between the first electrode and the second electrode.

19. A semiconductor device according to claim 17, each of the plurality of capacitors comprising:
a first conductive line and a second conductive line,
wherein the first conductive line and the second conductive line arranged in parallel in same interconnection layer.

20. A method for generating voltage signal including steps of:
providing a capacitance circuit comprising a plurality of capacitors each of which is connecting between an input node and output node,
storing charge to a smaller number of the capacitors than the whole number of the capacitors,
outputting the storing charge from the capacitance circuit.

* * * * *